United States Patent [19]
Tanaka et al.

[11] Patent Number: 5,467,309
[45] Date of Patent: Nov. 14, 1995

[54] SEMICONDUCTOR NONVOLATILE MEMORY DEVICE HAVING REDUCED SWITCHING OVERHEAD TIME ON THE PROGRAM MODE

[75] Inventors: Toshihiro Tanaka, Akigawa; Masataka Kato; Hitoshi Kume, both of Musashino; Keisuke Ogura, Tokorozawa; Tetsuo Adachi, Hachioji, all of Japan

[73] Assignee: Hitachi, Ltd., Tokyo, Japan

[21] Appl. No.: 252,604

[22] Filed: Jun. 1, 1994

[30] Foreign Application Priority Data

Sep. 6, 1993 [JP] Japan .................. 5-221143

[51] Int. Cl.$^6$ .................................. G11C 16/06
[52] U.S. Cl. .................... 365/185.14; 365/218
[58] Field of Search .................. 365/218, 185, 365/900, 189.01

[56] References Cited

U.S. PATENT DOCUMENTS

| 4,996,571 | 2/1991 | Kume et al. | 365/218 |
| 5,034,922 | 6/1991 | Burgess | 365/218 |
| 5,347,490 | 9/1994 | Terada et al. | 365/185 |

FOREIGN PATENT DOCUMENTS

| 2-289997 | 11/1990 | Japan . | |
| 0668686 | 11/1994 | Japan | 365/218 |

Primary Examiner—David C. Nelms
Assistant Examiner—Vu A. Le
Attorney, Agent, or Firm—Antonelli, Terry, Stout & Kraus

[57] ABSTRACT

A semiconductor nonvolatile memory device capable of reducing the overhead time of the time required for switching the verify operation and the verify operation itself. In the semiconductor nonvolatile memory device which operates to program the threshold of the memory cells on the basis of a plurality of repetitive operations, the mincing width $\Delta Vth$ of the variation of the threshold of the memory cells relative to one operation for changing the threshold (applying the program pulse) is expressed by $\Delta Vth = Kvth \cdot \log(t2/t1)$, and the ratio $(t2/t1)$ between the program pulse widths is expressed by $(t2/t1) = 10E(\Delta Vth/Kvth)$. The pulses in which the difference $\Delta Vth$ of the variation of the threshold of the memory cells is made constant, and the pulse width is increased as the repetition number increases are applied to the memory cells, thereby reducing the application number of program pulses.

13 Claims, 17 Drawing Sheets

BOTH $V_{TH} \geq 0$ V

LOWER $V_{TH} < 0$ V, $0 \leq$ UPPER $V_{TH} <$ VCC

LOWER $V_{TH} < 0$ V, UPPER $V_{TH} \geq$ VCC (OUTPUTS OF SENSE AMPLIFIER)

(OUTPUTS OF SENSE AMPLIFIER)

SEMICONDUCTOR NONVOLATILE MEMORY DEVICE HAVING REDUCED SWITCHING OVERHEAD TIME ON THE PROGRAM MODE

BACKGROUND OF THE INVENTION

The present invention relates, in general, to a semiconductor nonvolatile memory device, each constituted by a transistor, which is electrically programmable and erasable with respect to each threshold voltage, and more particularly to a semiconductor nonvolatile memory device in which the electrically programmable and erasable operation for a threshold is performed by applying repeatedly a plurality of pulses.

A semiconductor nonvolatile memory device having one transistor/cell structure which is capable of erasing the storage contents collectively is called "a flash memory". Since in the flash memory, from the viewpoint of its structure, an area occupied for 1 bit is small and the high integration can be realized, in recent years, the flash memory has received much attention, and the research and development of the structure and driving method thereof have been actively performed. For example, in JP-A-2-289997, there is disclosed the operation for lowering each threshold of a semiconductor nonvolatile memory device, i.e., memory cells, which performs the electrically programmable and erasable operation (programmable operation), i.e., an erase mode. The erase mode is an operation mode wherein the electric charges accumulated in a floating gate are discharged by utilizing the Fowler-Nordheim tunnel phenomenon. The threshold characteristics relating to that operation mode are shown in FIGS. 2 to 4. As shown in those Figures, the variation of the threshold with time in the logarithmic scale shows approximately a straight line after a certain lapse of time.

The threshold of the memory cell after completion of the electrically erasing operation should lie between the lower limit voltage of a power source voltage (Vccmin) and 0 V. Unlike the threshold voltage in the thermally equilibrium state in the case where the storage contents are erased by using the ultraviolet rays as in the EPROM, each threshold of the semiconductor nonvolatile memory device which performs the electrically erasing operation may go to a negative voltage while the electrically erasing operation is continued to be performed. In the case where the threshold of the memory cells is lowered to a negative voltage, the read operation and the like are adversely affected. For example, in the read operation, in the case where the threshold of the memory cells, connected to unselected word lines which are at a voltage of 0 V, lowered to the negative voltage, if the desired data line is selected, the memory current (the non-selection leakage current) is necessarily caused to flow into that data line. As a result, a time delay occurs in the read operation and a misread operation, in turn, may be caused in some cases. In order to prevent the time delay and the misread operation from occurring, conventionally, the erase operation was performed by applying repeatedly the erasing pulses in several times, and also it was verified that after completion of the erase operation, the threshold of the memory cells was equal to or higher than 0 V.

The algorithm of the conventional erase mode will hereinafter be described with reference to a flowchart of FIG. 35.

As shown in FIG. 35, prior to the erase operation, a prewrite processing 11 is executed. By the prewrite processing, it means the operation in which in order to prevent the threshold voltage (e.g., about 1 V) of the unwritten memory cells from being dropped down to the negative voltage due to the erase operation, the write operation is previously performed for all the memory cells.

In the prewrite processing 11, firstly, an initial address is set (Step 111), and then the write operation is performed for that address (Step 112). Then, it is judged whether or not that address is a final address (Step 113). Then, in the case where as a result of the judgement in Step 113, it is ascertained that that address is not the final address, after the address is incremented (Step 114), the processing is returned to Step 112 and the write operation is performed for the incremented new address. The loop of Steps 112, 113 and 114 is repeated until it is judged in Step 113 that the address of interest is the final address.

As a result of the judgement in Step 113, in the case where it is ascertained that the address of interest is the final address, the prewrite processing 11 is completed and then the processing of setting an address in Step 12 is performed.

After the initial address to be erased is set in Step 12, an erase pulse is generated and then the erase operation is performed for all the memory cells (Step 131). After completion of the erase operation, a state read operation, i.e., a verify operation, for judging whether or not the threshold of the memory cells reaches an erase threshold is performed (Step 132). In the verify operation, in the case where the threshold of the memory cell corresponding to a certain address does not reach the erase threshold, the processing is returned to Step 131 again and then the erase operation is repeatedly performed for all the memory cells (in a repetitive loop 13). In the verify operation in the repetitive loop 13, the judgement of the threshold is performed again from the same address. The loop of Steps 131 and 132 is repeatedly performed until it is judged in Step 132 that the threshold of the memory cell reaches the erase threshold.

In the case where it is judged in Step 132 that the threshold of the memory cell reached the erase threshold, it is judged whether or not the address of interest is the final address (Step 14). Then, as a result of the judgement in Step 14, in the case where it is ascertained that the address of interest is not the final address, after the address of interest is incremented (Step 15), the processing is returned to the verify operation in Step 132 again.

In the case where as a result of the judgement in Step 14, it is ascertained that the address of interest is the final address, it is judged that the threshold of all the memory cells had become the erase threshold, and then the erase mode is completed.

In the erase mode in the prior art as described above, the pulse width in the erase operation which is repeatedly performed is fixed.

In the above-mentioned prior art, it was assumed that the pulse width in the erase operation which was repeatedly performed in the erase mode was always fixed. In addition, in the case where the storage contents of the memory cells are erased, for example, as shown in FIG. 2, the characteristics of the threshold with time in the logarithmic scale show approximately a straight line. Therefore, in the case where the erase pulse width is fixed, the variation quantity of the memory threshold relative to each pulse is decreased as the number of erase operations further increases. As a result, there arises the problem that the time required for switching between the erase operation and the verify operation, and the verify operation itself become the overhead time, and as a result, the erase mode time is necessarily increased.

In addition, in the case where the control of the electrically programmable and erasable operation is executed by a central processing unit (a CPU) of a system located outside the semiconductor nonvolatile memory device, e.g., a portable system such as an automatically controlled camera system, a portable recorder or a pocket computer, there arise the problems that control of such an electrically programmable and erasable operation needs to be performed without separation of the buses between the semiconductor nonvolatile memory device and the external system and thus such a control becomes complicated, and in addition thereto, during that control operation, the CPU is occupied by the electrically programmable and erasable control of the semiconductor nonvolatile memory device.

SUMMARY OF THE INVENTION

It is therefore an object of the present invention to provide an electrically erasable semiconductor nonvolatile memory device which may provide that the overhead time of the time required for switching between the write operation and the verify operation of the memory cells and the verify operation itself can be reduced, the efficiency of the real program time in the electrically programmable and erasable mode (the program mode) can be improved, and the burden imposed on the external CPU can be reduced.

In order to achieve the above-mentioned object of the present invention, according to one aspect of the present invention, in a semiconductor nonvolatile memory device including memory cells, each constituted by a transistor, which is capable of being electrically programmable and erasable with respect to the threshold voltage, the program is performed by repeating a plurality of program operations, and also the state of the memory cell or memory cells, in which during the repetition of the plurality of program operations, at least one program operation is performed, is read out, i.e., verified, and on the basis of that information thus read out, the continuance and the stopping of the repetitive program operation of the memory device are controlled.

In addition, according to another aspect of the present invention, a program pulse width in the repetitive program operation is increased as the number of repetition further increases, and also the program pulse width corresponding to the number of repetition is made programmable.

Further, according to still another aspect of the present invention, both the program pulse width and the number of program operations can be controlled by the internal or external unit of the semiconductor nonvolatile memory device.

According to the semiconductor nonvolatile memory device of the present invention, the program pulse width is increased as the number of repetition further increases, whereby the difference or mincing width $\Delta V$th of the variation of the threshold of the memory cells relative to the number of operations for changing the threshold, i.e., the number of program pulses can be made constant, and the total number of operations for changing the threshold, i.e., the total number of program pulses can be reduced. In other words, the overhead time of the time required for switching between the program operation and the verify operation, and the time required for the verify operation itself can be shortened relative to the time required for the program operation mode.

In addition, means for controlling application of program pulses is provided in the inside of the semiconductor nonvolatile memory device, whereby the control by the CPU in the system in which the semiconductor nonvolatile memory device is employed has to be performed only for short time required for starting the program mode, and the subsequent program operation is automatically performed only in the inside of the semiconductor nonvolatile memory device. Therefore, the load imposed on the CPU can be remarkably reduced.

DESCRIPTION OF THE PREFERRED EMBODIMENTS

Prior to the description of the concrete configurations of the preferred embodiments of the present invention, firstly, a theoretical description of the principle of the present invention will hereinafter be made.

Figure 2:
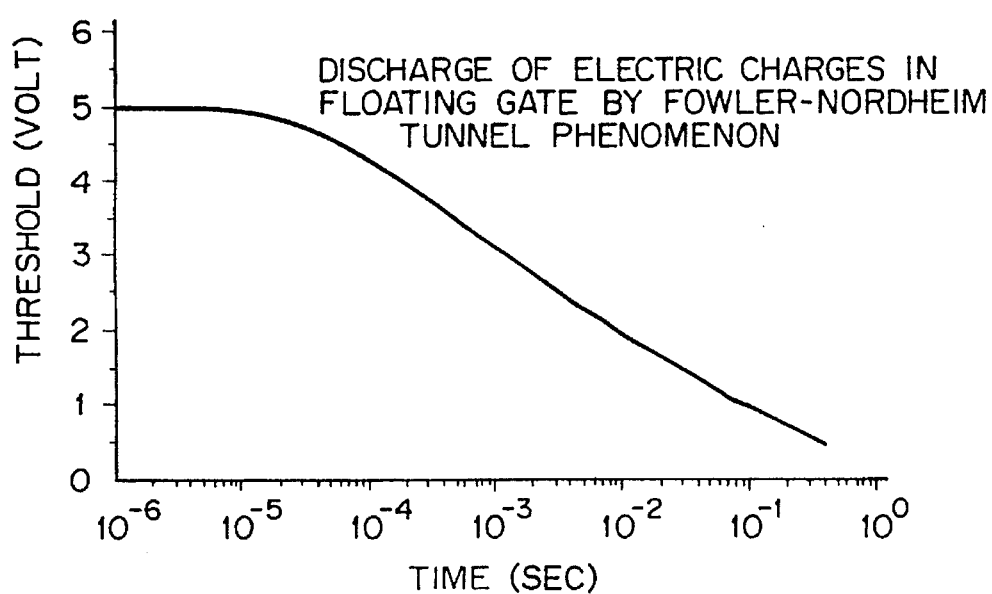
FIG. 2 is a graphical representation showing the variation of the threshold of the memory cell with time in the case where electric charges accumulated in a floating gate are discharged by utilizing the Fowler-Nordheim tunnel phenomenon.
Figure 3:
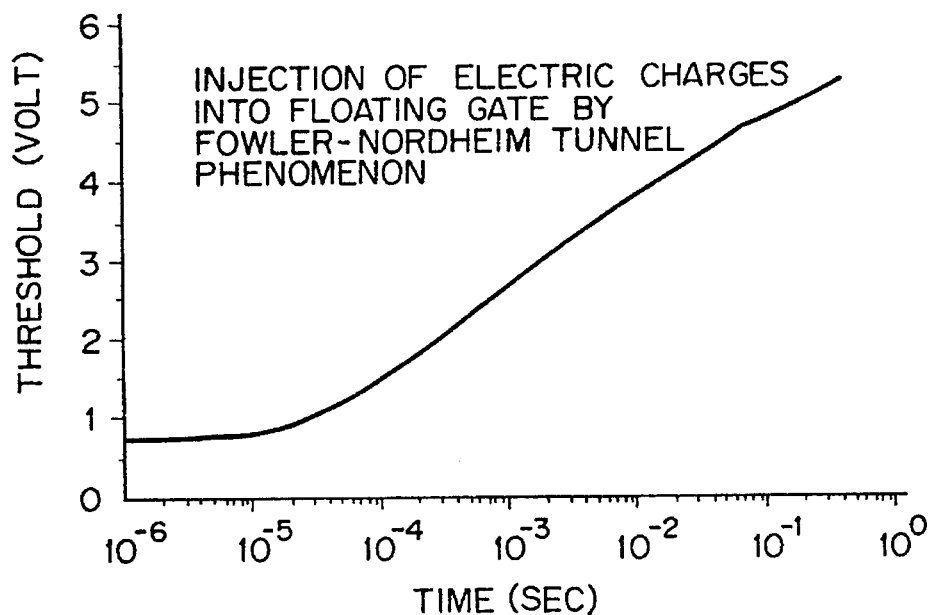
FIG. 3 is a graphical representation showing the variation of the threshold of the memory cell with time in the case where electric charges are injected into a floating gate by utilizing the Fowler-Nordheim tunnel phenomenon.
Figure 4:
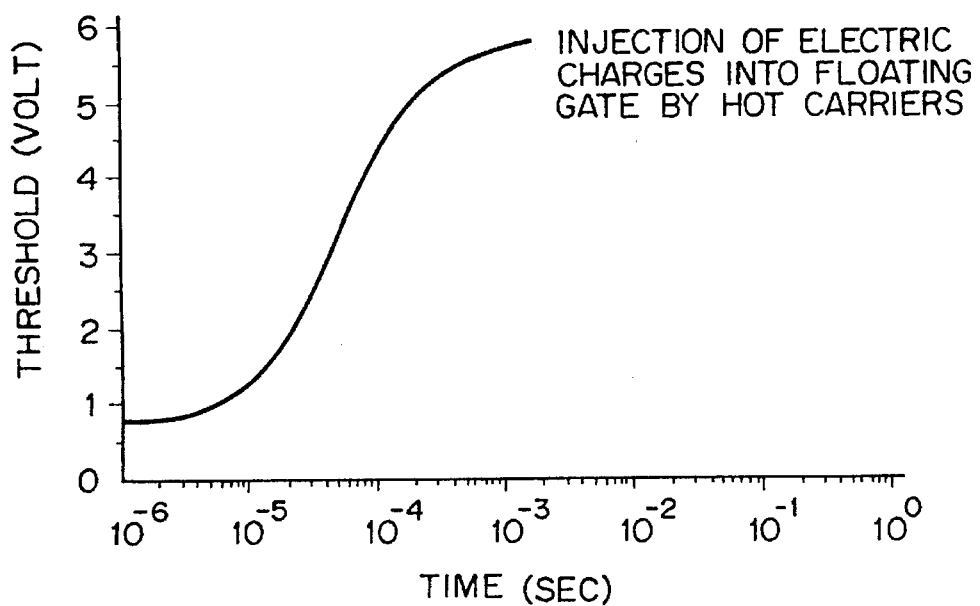
FIG. 4 is a graphical representation showing the variation of the threshold of the memory cell with time in the case where electric charges are injected into a floating gate by utilizing the hot carrier phenomenon.

As for the method of changing electrically a threshold of a memory cell, there are well known the method of discharging and injecting electric charges from and into a floating gate by utilizing the Fowler-Nordheim tunnel phenomenon, and the method of injecting electric charges into a floating gate by utilizing the hot carriers. In FIGS. 2 to 4, there are shown the characteristics of the variation of the threshold with time in accordance with those methods. In this connection, after a certain lapse of time in the case of the discharge of the electric charges by utilizing the Fowler-Nordheim tunnel phenomenon shown in FIG. 2 and in the case of the injection of the electric charges by utilizing the Fowler-Nordheim tunnel phenomenon shown in FIG. 3, and for a certain period of time in the case of the injection of the electric charges by utilizing the hot carrier method in FIG. 4, the variation of the threshold Vth of the memory cell with time in the logarithm scale, i.e., log (t) can be represented approximately by a straight line. The relational expression at that time can be expressed by Vth=Kvth log (t). Now, the constant Kvth is a gradient of the variation of the threshold relative to log (t).

In order to change the threshold of the memory cell with accuracy, as described above, the operation for changing the threshold is divided and the threshold is verified on the basis of the verify operation. In addition, in order to reduce the overhead time, as described above, the number of operations for changing the threshold repeatedly and the number of verify operations must be reduced.

For that purpose, the repetition number of operations for changing the threshold, i.e., the repetition number of the program pulses, is reduced, and also the operation time required for changing the threshold whenever the repetition number increases, concretely, the program pulse width is increased. That is, the operation time required for changing the threshold, i.e., the program pulse width, is increased as the repetition number increases, in such a way that the mincing width $\Delta$Vth of the variation of the threshold of the memory cell relative to the operation for changing the threshold by one time, concretely, the program pulse has a fixed value.

Figure 1:
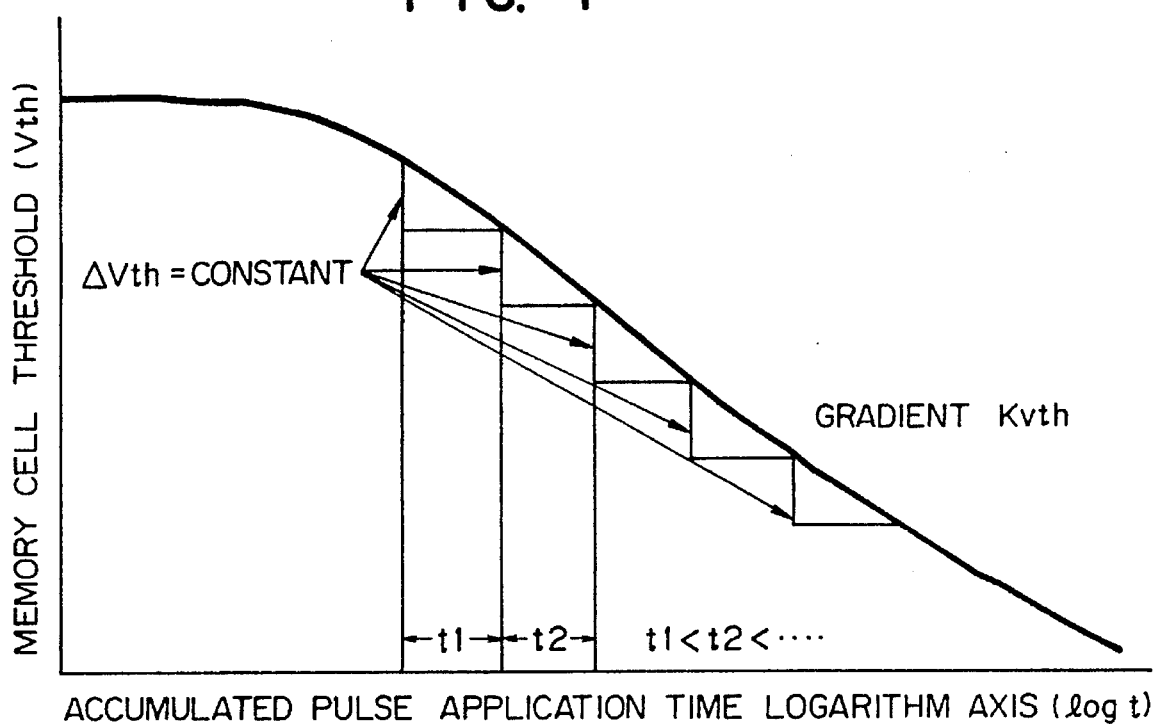
FIG. 1 is a graphical representation showing the relationship between the quantity of variation of a threshold of a memory cell and operation time required for changing the threshold, i.e., a program pulse width useful in explaining the principle of the present invention.

FIG. 1 is a graphical representation showing the typical characteristics of the variation of the threshold of the memory cell on the basis of the electrically programmable and erasable (programmable) operation. In order to fix the mincing width ΔVth of the variation of the threshold of the memory cell, the operation time (the program pulse width) required for changing the thresholds is successively increased every time the repetition number increases (t1<t2< . . .). As a result, the number of operations for changing the threshold (i.e., the number of program pulses) can be effectively reduced.

On the basis of the above-mentioned expression Vth= Kvth·log (t), the mincing width ΔVth of the variation of the threshold of the memory cell relative to the operation for changing the threshold by one time (the program pulse) can be expressed by:

$$\Delta Vth = Kvth \cdot \log (t_2/t_1)$$

In addition, the ratio between the operation time required for changing the threshold (the program pulse width) can be expressed by:

$$(t_2/t_1) = 10E(\Delta Vth/Kvth)$$

where the right member 10E(ΔVth/Kvth) represents 10 to the (ΔVth/Kvth)-th power.

The gradient Kvth of the variation of the threshold relative to the time logarithm axis (log (t)) is a value, inherent in the memory cell device, which depends on the thicknesses of a tunnel insulating film and an interlayer insulating film of the memory cell, the voltages applied to the terminals of the memory cell, and the like.

Now, it is assumed that the absolute value of the gradient Kvth of the variation of the threshold relating to the logarithm of time is 0.664. In the case where the mincing width ΔVth of the variation of the threshold is controlled by 0.2 V, the ratio between the operation time required for changing the threshold (the program pulse width) becomes 2. In other words, the ratio between the operation time required for changing the threshold (the program pulse width) is always made a fixed value, whereby the control can be performed with the necessary minimum repetition number and with the mincing width ΔVth of the variation of the threshold always made a fixed value.

Figure 5:
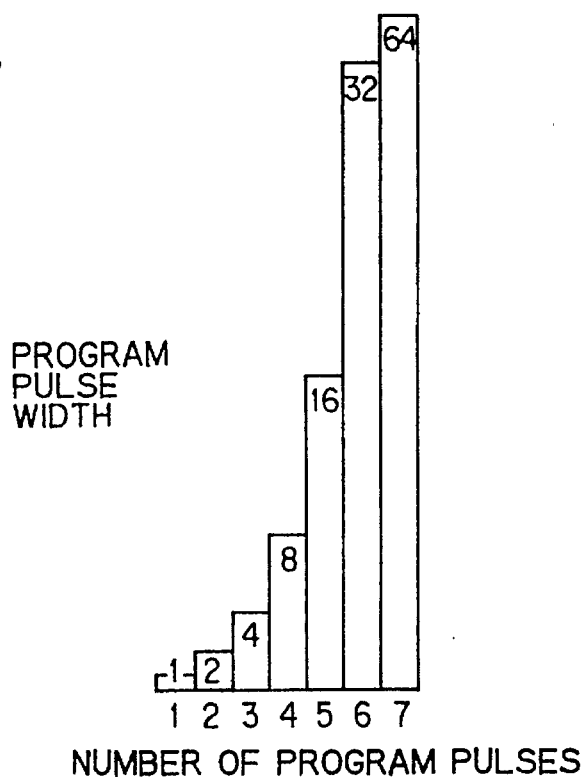
FIG. 5 is a graphical representation showing the relationship between the number of program pulses and a program pulse width in the case where a program pulse twice as wide as a prior program pulse is supplied.
Figure 6:
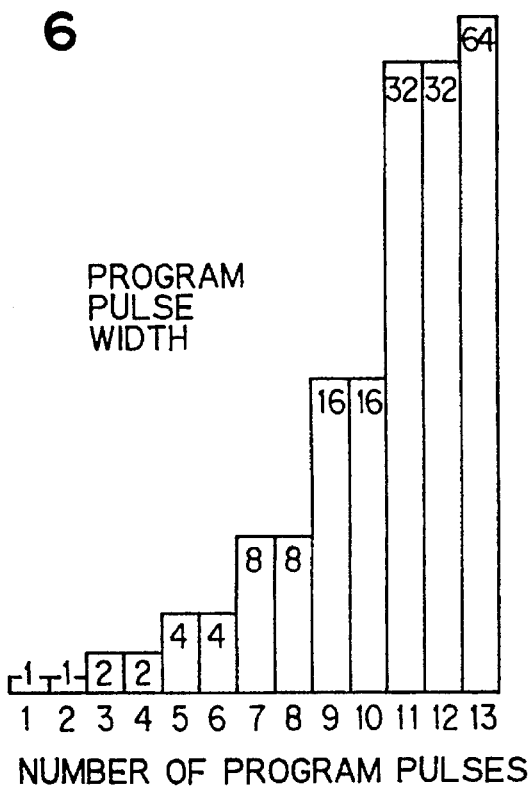
FIG. 6 is a graphical representation showing the relationship between the number of program pulses and a program pulse width in the case where the same program pulse is repeatedly supplied by two times.

FIGS. 5 and 6 show the relationship between the number of operations (program pulses) for changing the threshold and the operation time (the program pulse width) required for changing the threshold according to the above-mentioned principle of the present invention. FIG. 5 shows the state in which the operation time (the program pulse width) required for changing the threshold is increased at a fixed ratio (of two times) in relation to the number of operations for changing the threshold (the program pulse). In addition, FIG. 6 shows the state in which the operation time (the program pulse width) required for changing the threshold is divided into a plurality of times, e.g., two times. At this time, the mincing width ΔVth of the variation of the threshold of the memory cell becomes gentle.

Incidentally, some of the present inventors have already proposed the method of erasing electrically the nonvolatile memory cells at the same time, satisfying the above-mentioned principle, in JP-A-6-68686 laid open Mar. 11, 1994 (Japanese-Patent Application No. 4-222499 filed Aug. 21, 1992), which is not admitted as prior art, and of which the disclosure is incorporated herein by reference.

Figure 7:
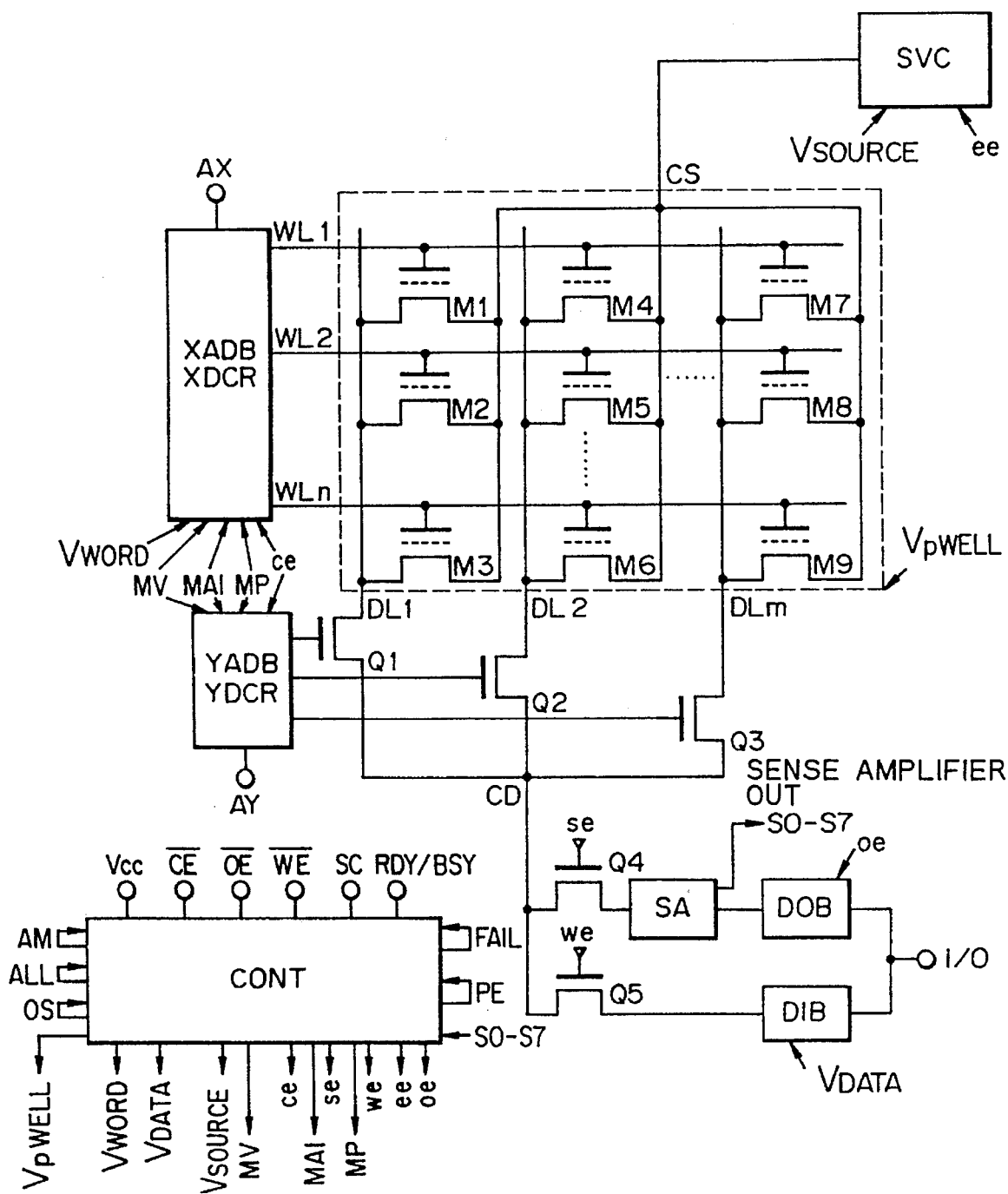
FIG. 7 is a circuit diagram showing a configuration of an embodiment of a semiconductor nonvolatile memory device according to the present invention.

Next, the description will hereinafter be given with respect to an example of the concrete configuration of the present embodiment. In FIG. 7, a circuit diagram of the semiconductor nonvolatile memory device according to the present embodiment is shown.

Circuit elements shown in FIG. 7 are, while in not particularly limited thereto, formed on a semiconductor substrate, such as one monocrystalline silicon, by the well known technology for manufacturing a complementary MOS (CMOS) integrated circuit for example.

In addition, while not particularly limited thereto, the integrated circuit is for example, formed on a semiconductor substrate made of monocrystalline p type silicon. An n-channel MOS FET includes, but is not limited to, a source region and a drain region which are formed on a surface of such a semiconductor substrate, and a gate electrode which is made of polysilicon or the like and is formed on the semiconductor substrate and between the source region and the drain region through a thin gate insulating film. A p-channel MOS FET is formed in an n type well region which is formed on the surface of the semiconductor substrate. Thus, the semiconductor substrate constitutes the substrate gate common to a plurality of n-channel MOS FETs formed thereon, and the ground potential for the circuit is supplied. The substrate gate common to the p-channel MOS FETs, i.e., the n type well region is connected to a power supply voltage Vcc. Alternatively, if the circuit of interest is a high voltage circuit, the n type well region is connected to the high voltage Vpp given from the outside, the internally generated high voltage and the like. Alternatively, the integrated circuit may be formed on the semiconductor substrate made of monocrystalline n type silicon. In this case, each of the n-channel MOS FETs is formed in the p type well region.

In addition, while not particularly limited thereto, in the semiconductor nonvolatile memory device of the present embodiment, for example, complementary address signals which have been formed through row and column address buffers XADB and YADB, which receive respectively row and column address signals AX and AY supplied from respective external terminals, are respectively supplied to row and column address decoders XDCR and YDCR. Further, while not particularly limited thereto, for the row and column address buffers XADB and YADB are activated by a selection signal ce which is generated inside the system, and fetch address signals AX and AY, supplied from the respective external terminals, to form a complementary address signal which includes an internal address signal in phase with the address signal supplied from the external terminal and an internal address signal in opposite phase therewith.

The row address decoder XDCR forms a selection signal used to select the desired word line WL of the group of memory cells according to the complementary address signal outputted from the row address buffer XADB, and the column address decoder DCR forms a selection signal used to select the desired data line DL of the group of memory cells according to the complementary address signal outputted from the column address buffer YADB. The electric potential on the associated word line WL of the group of memory cells is a potential Vword on the associated word line of the power supply voltage inputted to the row address decoder XDCR.

While not particularly limited, for example to, since with respect to the selection of the memory cells, the write operation and the read operation are performed in units of 8 or 16 bits, the 8 or 16 memory cells are selected by both the row address decoder XDCR and the column address decoder YDCR. In this connection, with respect to the number of memory cells in one data block, the m memory cells are arranged in the word line direction (in the row direction) and the n memory cells are arranged in the data line direction (in the column direction) to form a matrix of memory cells where n and m are positive integers. In other words, the group of memory cells are constituted by the 8 or 16 data blocks each having (m×n) memory cells.

The above-mentioned memory cell has, while not particularly limited thereto, a similar structure to that of a memory cell of an EPROM, for example, which is a well known memory cell having a control gate and a floating gate or having a control gate, a floating gate and a selection gate.

Each memory cell shown in FIG. 7 has a structure including a control gate and a floating gate. The memory cell group in which a plurality of memory cells are connected to one another is, but is not limited to, for example, as shown in FIG. 7, constituted by memory cells MOS FETs M1 to M9 which are formed in a p type well region having a Vpwell potential supplied thereto, word lines WL1 to WLn, data lines DL1 to DLm, and a common source line CS. The electric potential on the common source line CS is switched to the ground potential Vss of the circuit in the operation for reading out the data and the verify operation, and to the high voltage Vsource in the operation for changing the threshold of the memory cells by a circuit SVC for switching the source potential. In the memory cell group shown in FIG. 7, the control gates of the memory cells which are arranged in the same row, e.g., M1, M4, . . ., M7 are connected to the same word line WL1, and the drains of the memory cells which are arranged in the same column, e.g., M1, M2, . . ., M3 are connected to the same data line DL1.

The data lines DL1 to DLm are connected to a common data line CD through column selection switches MOS FETs Q1, Q2, . . ., Q3 each of which receives a selection signal produced by the address decoder YDCR. To the common data line CD, an external terminal of a writing data input buffer DIB which receives a write signal inputted from an external terminal I/O is connected through a MOS FET Q5 which is, in the write operation, turned on to receive a write control signal we. In the write operation, the power source voltage Vdata inputted to the input buffer DIB becomes the voltage of the drain terminals of the associated memory cells. The common data line CD is coupled to a sense amplifier SA through a switch MOS FET Q4 which is, in the read operation, turned on to receive a read control signal se and also is connected to the external terminal I/O via a reading data output buffer DOB. In addition, alternatively, the configuration may be adopted such that the sense amplifiers SAs are connected to the respective data lines DL1, DL2, . . ., DLm and are connected to the common data line CD through the respective column selection switches MOS FETs Q1, Q2, . . ., Q3. At this time, in the case where the sense amplifier SA is constituted by a latch circuit and is provided with the function of holding the writing data, the power source voltage of the sense amplifier SA becomes Vdata.

Since in the memory cell having a higher threshold, namely, in which electrons are accumulated in its floating gate, even if the selection potential is supplied to the control gate, i.e., the associated word line WL, no drain current is caused to flow therethrough. On the other hand, since the memory cell, in which no electron is injected into the floating gate, has a lower threshold, when the selection potential is supplied to the associated word line WL, the drain current is caused to flow therethrough. The drain current is read out by the sense amplifier SA, whereby the level of the threshold of the memory cell is used as the information of the memory device.

In a timing control circuit CONT shown in FIG. 7, while not particularly limited thereto, for example, in correspondence to a chip enable (ce) signal, an output enable (oe) signal, a write enable (we) signal, a serial control (sc) signal, a ready/busy (rb) signal and the like which are respectively supplied to external terminals ($\overline{CE}$), ($\overline{OE}$), ($\overline{WE}$), (SC), (RDY/BSY) and the like, the timing signals such as the internal control signals ce, se, we and oe, and the internal power source voltages such as a word line supply voltage Vword which is connected to the selected gate terminals of the memory cells, the data line supply voltage Vdata which becomes the voltage of the drain terminals of the memory cells, and the source line supply voltage Vsource which becomes the voltage of the source terminals of the memory cells are generated by the internal boosting and the internal dropping of the power supply voltage Vcc. In addition, the above-mentioned power supply voltages may be supplied from the outside. Incidentally, the mark "¯" shown in ($\overline{CE}$), ($\overline{OE}$) and ($\overline{WE}$) in the present specification represents the complementary signal. Outputs S0 to S7 of the sense amplifier SA are inputted to the timing control circuit CONT. The operation signals MY, MAI and MP (refer to FIG. 32) are also generated by the timing control circuit CONT to be supplied to AX and AY.

With respect to the operation modes such as the read operation and the program operation (the erase operation and the write operation), by both the activation of the external signals ($\overline{CE}$) and ($\overline{WE}$), and the input of the data at the external terminal I/O, e.g., the input of the command on the basis of the read operation 00H, the erase operation 20H, the write operation 10H and the like, the operation modes are provided, and the internal signals required for the operations are generated by the timing control circuit CONT. In addition, whether or not the memory device is in the program operation, the program operation has been completed, the memory device is in the erase operation, and the memory device is in the write operation can be known from the outside on the basis of the status polling, the ready/busy signal, or the like. In the operation for reading continuously the data in sectors, the operation for receiving the write data, i.e., the sector data in sectors, and the like, the data may be outputted and inputted synchronously with the signal supplied from the external terminal SC.

In the read operation, both the word line WL and the data line DL which are connected to the memory cell, from which the data is to be read out, are selected.

Figure 8:
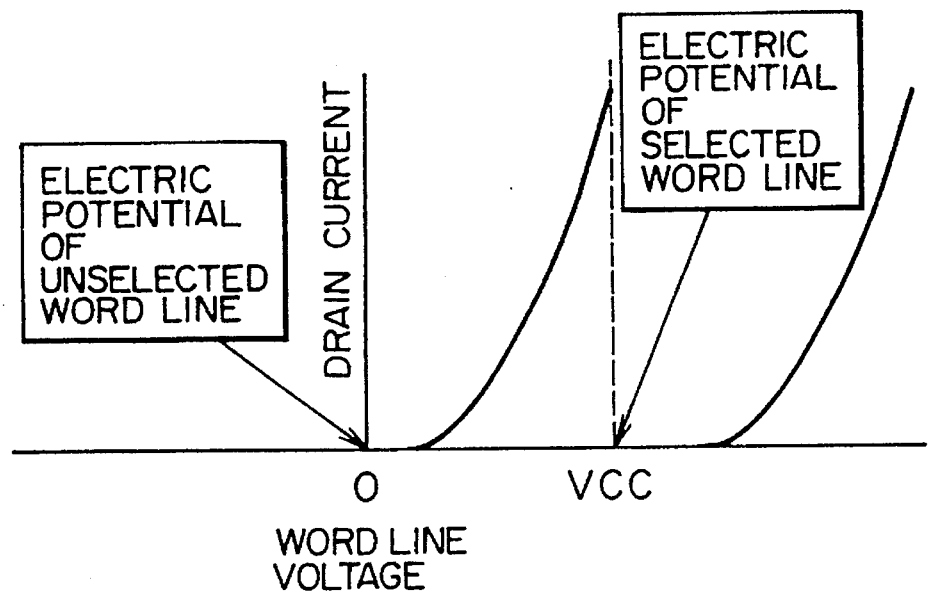
FIG. 8 is a graphical representation showing the characteristics of the threshold, in the case where the thresholds of two states are equal to or higher than 0 V, as the characteristics of a drain current with a word line voltage in the read operation of the present invention.
Figure 9:
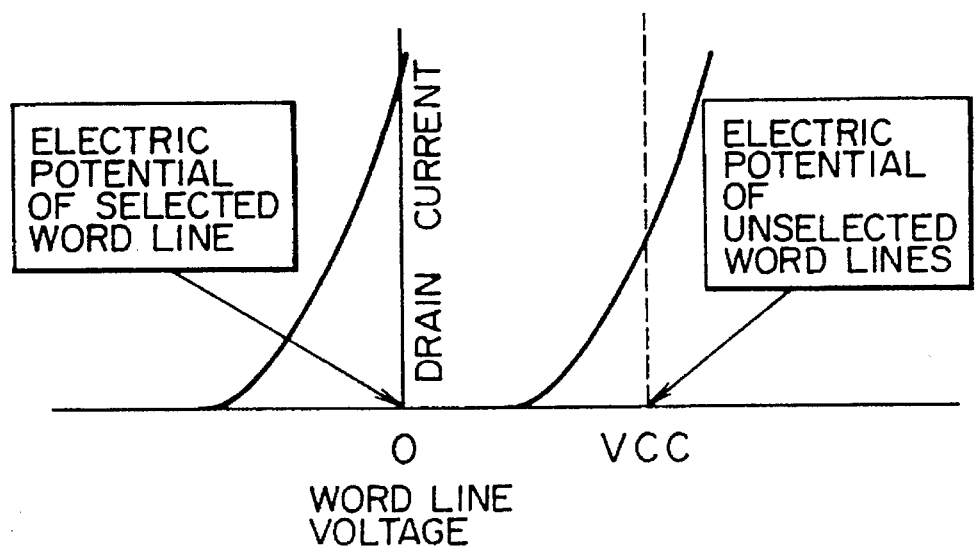
FIG. 9 is a graphical representation showing the characteristics of the threshold, in the case where a lower threshold is lower than 0 V and a higher threshold is equal to or higher than 0 V but equal to or lower than Vcc, as the characteristics of a drain current with a word line voltage in the read operation of the present invention.
Figure 10:
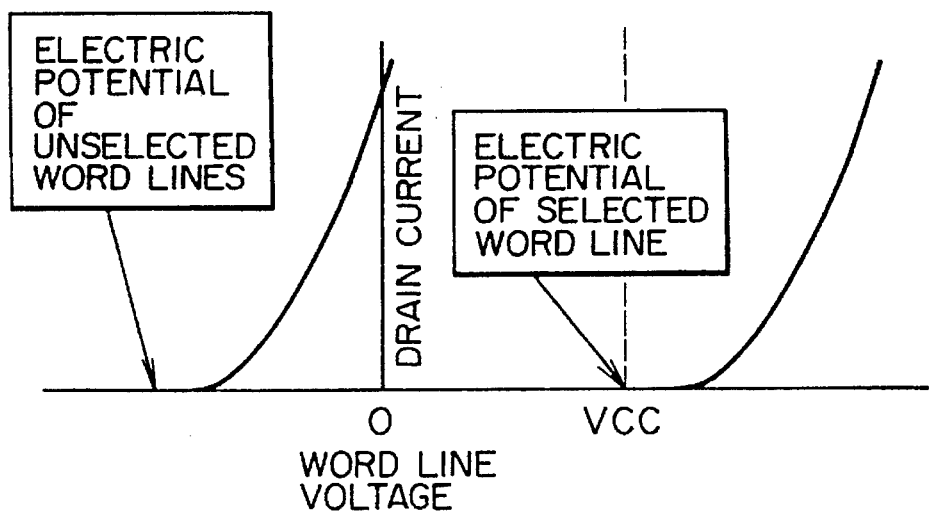
FIG. 10 is a graphical representation showing the characteristics of the threshold, in the case where a lower threshold is lower than 0 V and a higher threshold is equal to or higher than Vcc, as the characteristics of a drain current with a word line voltage in the read operation of the present invention.

FIGS. 8 to 10 show current characteristics, i.e., threshold characteristics in two states of the memory cell relative to the word line voltage in the read operation.

FIG. 8 shows an example in the case where both the thresholds of the two states of the memory cell are equal to or higher than 0 V. The read voltage of the selected word line at that time is a positive voltage value between the thresholds of the two states, e.g., the power supply voltage Vcc. In addition, the voltage of the unselected word lines is equal to or lower than the voltage corresponding to the lower threshold, e.g., the ground voltage Vss.

FIG. 9 shows an example in the case where the lower threshold is lower than 0 V, and the higher threshold is equal to or higher than 0 V but equal to or lower than the power supply voltage Vcc. In the case as shown in the figure, the voltage of the selected word line is a voltage between the thresholds of the two states, e.g., the ground voltage Vss, and the voltage of the unselected word lines is equal to or higher than the voltage corresponding to the higher threshold, e.g., the power supply voltage Vcc.

FIG. 10 shows an example in the case where the lower threshold is lower than 0 V, and the higher threshold is equal to or higher than the power supply voltage Vcc. The voltage of the selected word line is a voltage between the thresholds of the two states, e.g., the power supply voltage Vcc, and the voltage of the unselected word lines is equal to or lower than the voltage corresponding to the lower threshold, i.e., the negative voltage.

In the circuit diagram of the semiconductor nonvolatile memory device shown in FIG. 7, in the program operation (the erase operation and the write operation) mode as the operation for changing the threshold of the memory cells, in accordance with the definition with respect to the thresholds of the selected and unselected memory cells in the read operation shown in FIGS. 8 to 10, the word line supply voltage Vword is supplied from the row address decoder XDCR to the control gate terminals of the selected memory cell and the unselected memory cells, the data line supply voltage Vdata is supplied from the sense amplifier SA to the drain terminals thereof, and the source line supply voltage Vsource is supplied to the source terminals thereof by the circuit SVC for switching the source potential.

Figure 11:
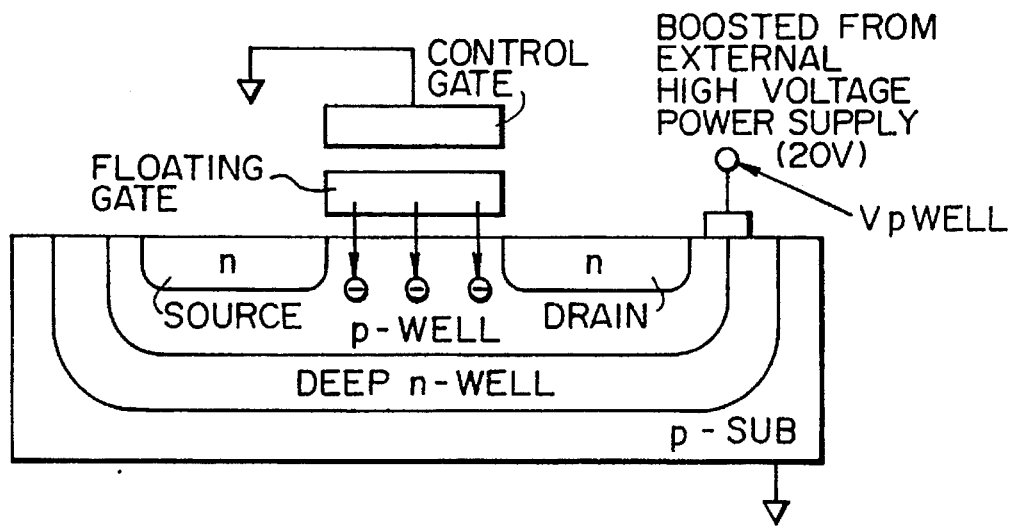
FIG. 11 is a cross sectional view showing each of terminal voltages of the memory cell in the operation for lowering the threshold of the memory cell in the full surface tunnel method in the case where the external power source voltage is a high voltage.
Figure 12:
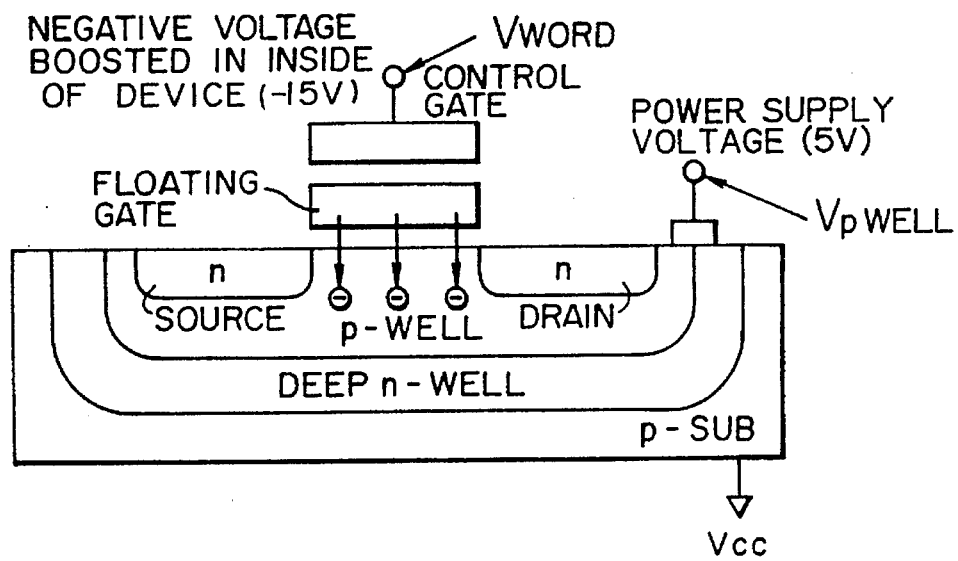
FIG. 12 is a cross sectional view showing each of terminal voltages of the memory cell in the operation for lowering the threshold of the memory cell in the full surface tunnel method in the case where the external power source is a single power source.
Figure 13:
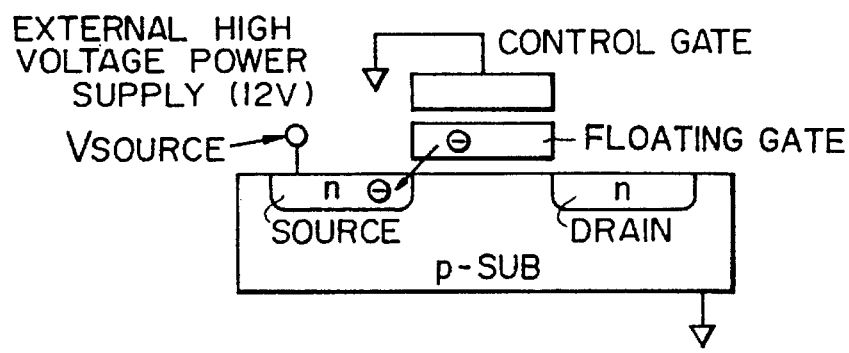
FIG. 13 is a cross sectional view showing each of terminal voltages of the memory cell in the operation for lowering the threshold of the memory cell in the source edge tunnel method in the case where the external power source voltage is a high voltage.
Figure 14:
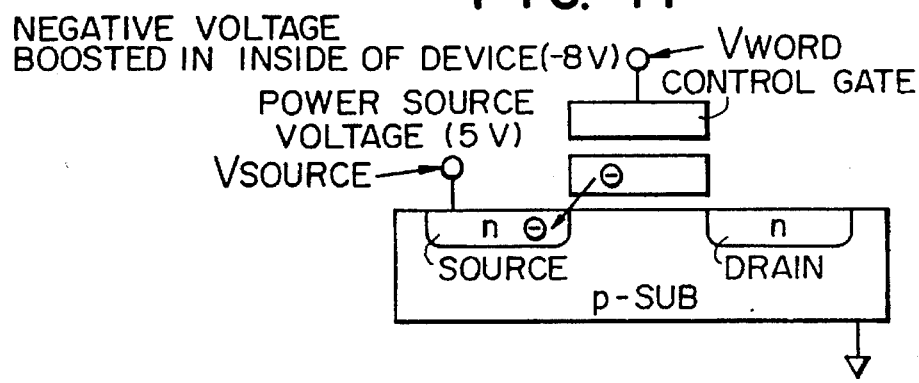
FIG. 14 is a cross sectional view showing each of terminal voltages of the memory cell in the operation for lowering the threshold of the memory cell in the source edge tunnel method in the case where the external power source is a single power source.
Figure 15:
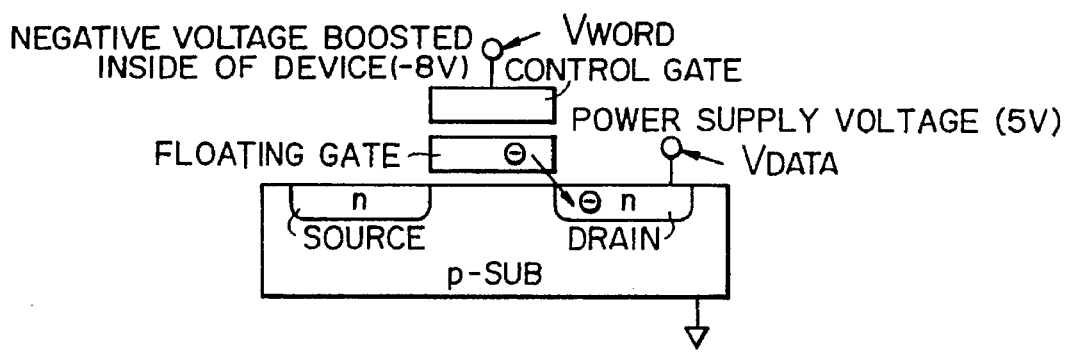
FIG. 15 is a cross sectional view showing each of terminal voltages of the memory cell in the operation for lowering the threshold of the memory cell in the drain edge tunnel method in the case where the external power source is a single power source.

In order to lower the threshold of the memory cells, the electric charges accumulated in the floating gate are discharged by utilizing the Fowler-Nordheim tunnel phenomenon. FIGS. 11 to 15 show the voltages of the terminals of the memory cells. In this connection, FIGS. 11 and 12 show the method of utilizing the full surface tunnel phenomenon occurring between the floating gate and the substrate, and FIGS. 13, 14 and 15 show the method of utilizing the edge tunnel phenomenon occurring between the floating gate and the source or drain. In addition, FIGS. 11, 12, 13 and 14 show the erase operation for activating collectively the memory cell group connected to the common p type well region or the common source, and FIG. 15 shows the write operation in which the threshold of the memory cell can be selectively lowered by the drain side electric potential.

FIGS. 11 and 12 show the structure in which a p type well region is formed on a deep n type well region and the memory cell is formed thereon. In the method shown in FIG. 11, the potential Vpwell, e.g., 20 V, which has been obtained by the boosting from the voltage of the external high voltage power supply is supplied to at least both the p type well region and the deep n type well region of the substrate, and the potential at the control gate is made 0 V, whereby the tunnel current is caused to flow from the floating gate into the substrate, thereby discharging the electric charges. At this time, the threshold of the memory cell is switched over from a higher state to a lower state. Incidentally, in order to maintain the threshold at the higher state, the potential which has been obtained by boosting the voltage of the external high voltage power supply may be applied to the control gate.

FIG. 12 shows the structure in which the external power sources can be made a single power source. That is, the potential of the substrate is made the power supply voltage Vcc, and the negative voltage Vword, e.g., −15 V, which has been obtained by the boosting in the inside of the device is supplied to the control gate. In addition, the potential at each of the unselected control gates is made the power supply voltage Vcc or 0 V.

In the method shown in FIG. 13, the potential at the control gate is made 0 V, and the voltage of the source terminal is made the voltage Vsource, e.g., 12 V, of the external high voltage power supply. Then, the electric charges accumulated in the floating gate are drawn therefrom to the source terminal side by the electric field caused by the high voltage Vsource of the source terminal, e.g., 12 V.

FIG. 14 shows the structure in which, unlike the structure of FIG. 13, the external power supplies can be made a single power supply. In this case, the negative voltage Vword which has been obtained by the boosting effected inside of the device, e.g., −8 V, is supplied to the control gate, and the potential source at the source terminal is made the power supply voltage Vcc, e.g., 5 V. In addition, the potential at each of the unselected control gates is the power supply voltage Vcc.

FIG. 15 shows an example in which unlike the method of FIG. 13, the electric charges accumulated in the floating gate are drawn therefrom to the drain terminal side by utilizing the edge tunnel phenomenon. Thus, the electric charges are drawn to the drain terminal side by utilizing the edge tunnel phenomenon, whereby the potential Vdata can be selectively supplied to the drain terminal. Therefore, this operation can be defined as the write operation. In this case, the potential at the drain terminal is controlled to be either the power supply voltage Vcc, e.g., 5 V, or the ground voltage Vss, for example, whereby the discharge and the holding of the electric charges accumulated in the floating gate can be controlled.

Figure 16:
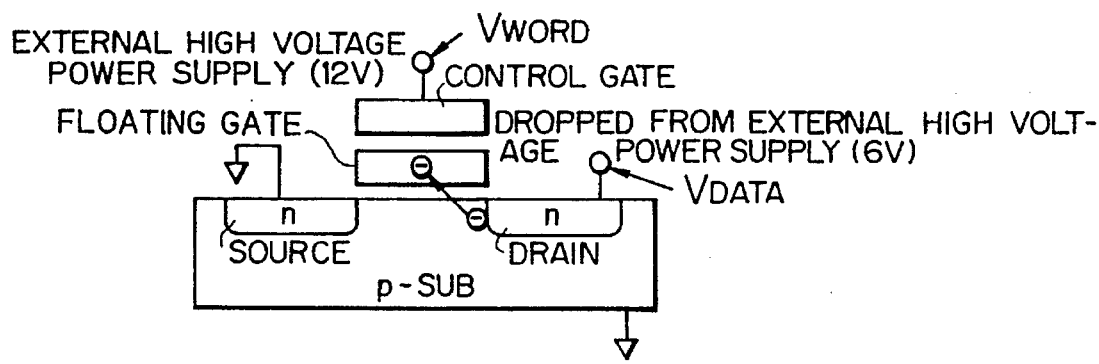
FIG. 16 is a cross sectional view showing each of terminal voltages of the memory cell in the operation for increasing the threshold of the memory cell in the hot carrier method in the case where the external power source voltage is a high voltage.
Figure 17:
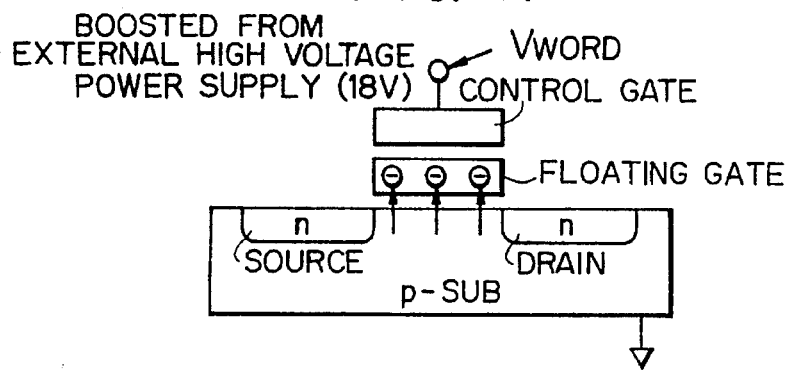
FIG. 17 is a cross sectional view showing each of terminal voltages of the memory cell in the operation for increasing the threshold of the memory cell in the full surface tunnel method in the case where the external power source voltage is a high voltage.
Figure 18:
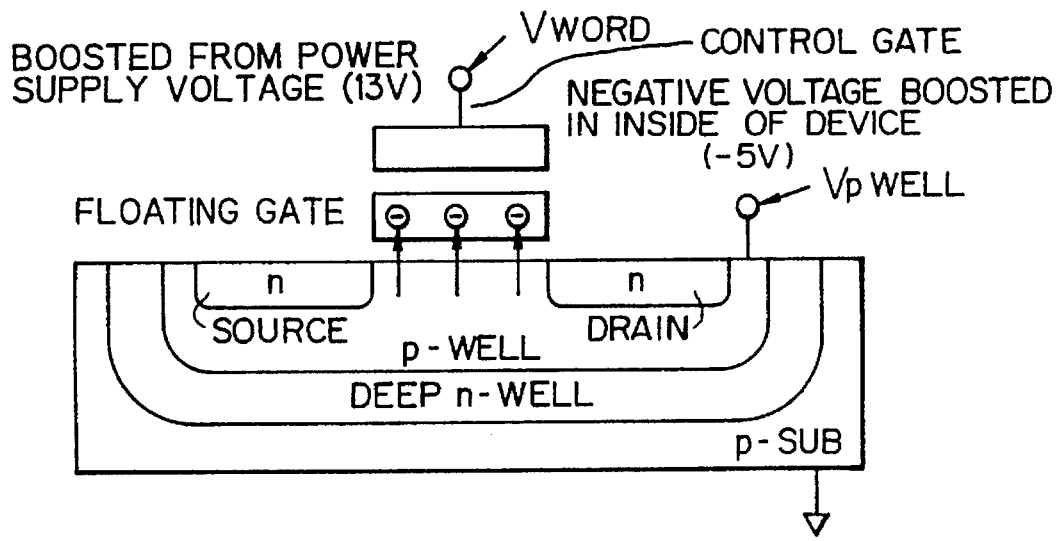
FIG. 18 is a cross sectional view showing each of terminal voltages of the memory cell in the operation for increasing the threshold of the memory cell in the full surface tunnel method in the case where the external power source is a single power source.

On the other hand, in order to increase the threshold of the memory cell, the electric charges are injected into the floating gate by utilizing either the hot carrier method or the Fowler-Nordheim tunnel phenomenon. FIGS. 16 to 18 show electric potentials applied to the respective terminals of the memory cell. In this connection, FIG. 16 shows the method of utilizing the hot carriers which are injected from the drain into the floating gate, and FIGS. 17 and 18 shows the method of utilizing the full surface tunnel phenomenon occurring between the floating gate and the substrate. In addition, in FIG. 16, since the threshold of the memory cell can be selectively increased by the drain side potential, this operation is the write operation. On the other hand, referring to illustrations of FIGS. 17 and 18, there is explained an erase operation for activating collectively the memory cell group connected to the substrate or the common p type well region. However, this erase operation can also be utilized as the write operation by supplying the selection potential and the non-selection potential to the drain terminal and the source terminal, respectively. In FIG. 18, the p type well region is formed on the deep n type well region, and the memory cell is formed thereon.

In the method shown in FIG. 16, a high voltage (e.g., 12 V) is supplied from the external high-voltage power supply Vword to the control gate of the memory cell, and the voltage of the drain terminal is selectively made either the potential Vdata, e.g., 6 V, which has been obtained by the dropping from the voltage of the external high voltage power supply for example or the ground potential Vss, whereby the hot carriers can be controlled which have been generated in the vicinity of the drain region. By injecting the hot carriers into the floating gate, the threshold of the memory cell is changed from the lower state to the higher state.

In the method shown in FIG. 17, the voltage of the substrate is made the ground voltage Vss, and the high voltage Vword, e.g., 18 V, which has been obtained by the boosting from the voltage of the external high voltage power supply is supplied to the control gate, whereby the electric charges are injected from the substrate into the floating gate. The potential at each of the unselected control gates is the ground voltage VSS. In the case where this operation is utilized as the write operation, the selection electric potential, e.g., the ground potential Vss, and the non-selection potential, e.g., the high voltage, are respectively applied to the drain terminal and the source terminal, and also the channel potential is controlled, whereby the electric charges can be selectively injected into the floating gate.

In the method shown in FIG. 18, unlike the method of FIG. 17, the external power supplies can be made a single power supply. In this case, the potential at the p type well region of the substrate is made the negative voltage which has been obtained by boosting in the inside of the device Vpwell, e.g., −5 V, the high voltage Vword, e.g., 13 V, which is lower than that shown in FIG. 17 and has been obtained by the boosting from the voltage of the external power supply is supplied to the control gate.

In the methods of FIGS. 11 to 15 and FIGS. 16 to 18 in which the high voltage is used as the external power supply voltage, the external power supply may provide the self-contained power supply which has the capability of sufficiently supplying the current in the inside of the device on the basis of the single power supply.

The threshold after changing the threshold of the memory cells needs to secure its voltage value and the memory cell current and to be arranged in a certain range. For example, in the threshold characteristics of FIG. 9 in which the lower threshold is lower than 0 V, and the higher threshold is equal to or higher than 0 V but equal to or lower than Vcc, in the case where the lower threshold state is realized on the basis of the full surface tunnel method of FIG. 11, and that operation is utilized as the erase operation, in the read operation in which for example, the potential on the selected word line is 0 V, it is necessary to secure the current value. In addition, as described in the prior art, in the threshold characteristics of FIG. 8 in which both the thresholds of the two states are equal to or higher than 0 V, in the case where the lower threshold state is utilized as the write operation on the basis of the edge tunnel method of FIG. 13 or 15, the threshold needs to be controlled between the lower limit voltage Vccmin of the power supply voltage and 0 V.

Therefore, in order to change the thresholds of the memory cells with accuracy, as described above, the operation for changing the thresholds (the program pulse) needs to be divided, the operation (the verify operation) for reading and verifying the states of the threshold of the memory cells needs to be performed at every dividing operation, and on the basis of that information thus read out, the continuance and stopping of the operation for changing the threshold of the memory cells need to be controlled.

Figure 19:
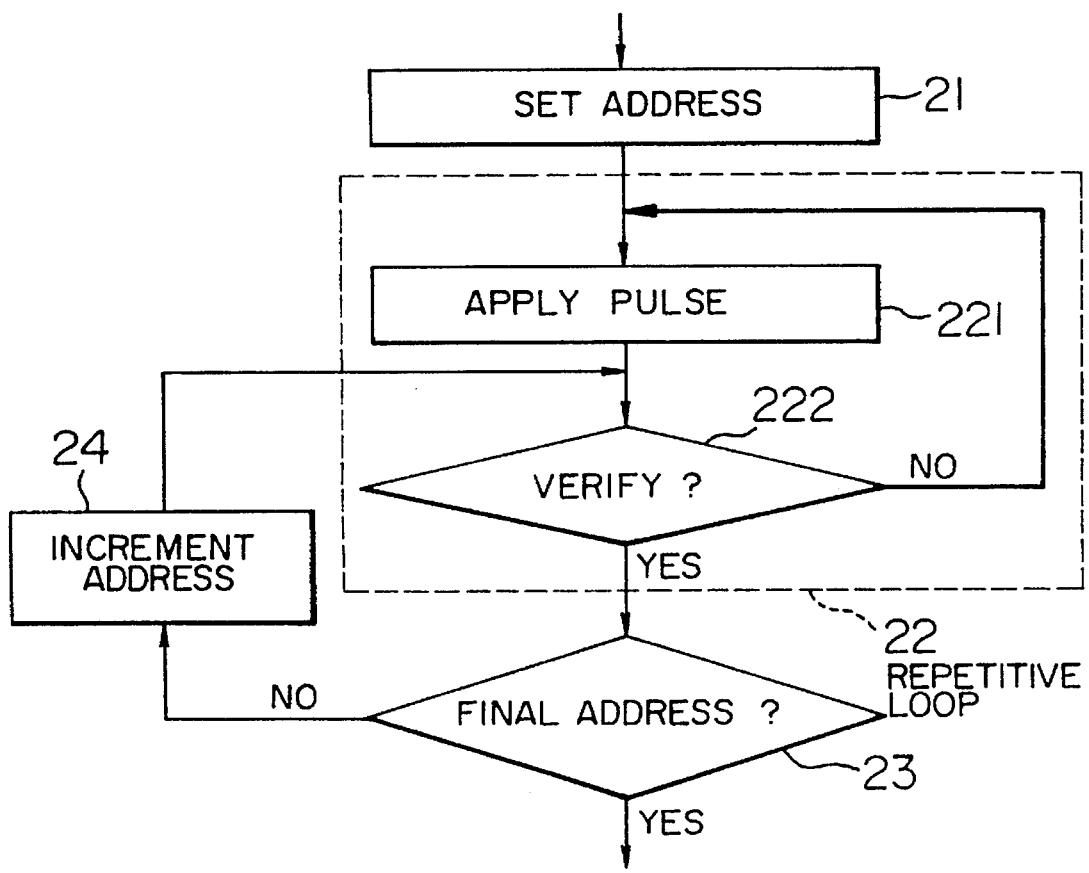
FIG. 19 is flowchart showing the operation algorithm, for changing the threshold, of the present invention.

FIG. 19 shows an operation algorithm for changing the threshold of the memory cells with accuracy. In FIG. 19, first, after setting an initial address used to change the threshold (Step 21), the operation of the repetitive loop 22 is performed. In the operation of the repetitive loop 22, the divided pulse (the program pulse) used to change the threshold is applied (Step 221), and then the operation for reading out and verifying the state of the threshold of the memory cells (the verify operation in Step 222) is performed. If the fail (NO) is judged on the basis of the judgement in the verify operation, the operation for applying the program pulse (Step 221) is repeated again. On the other hand, if the pass (YES) is judged on the basis of the judgement in the verify operation, it is judged whether or not the address of interest is a final address (Step 23). Then, if the address of interest is judged not to be the final address, the address is incremented (Step 24), and then the processing is returned to the verify operation in Step 222. On the other hand, if the address of interest is judged to be the final address, the processing of changing the threshold will be completed.

As can be seen from the threshold characteristics of the memory cell shown in FIGS. 2 to 4, in a certain accumulated time, the variation of the threshold of the memory cell relative to the time logarithm axis (log (t)) can be approximately represented by the straight line. The gradient Kvth of the variation of the threshold relative to the time logarithm axis is, as described above, the value inherent in the memory cell device. In addition, as described above, in the case where the absolute value of the gradient Kvth of the variation of the threshold relative to log (t) is 0.664, and the mincing width ΔVth of the variation of the threshold is 0.2 V, the ratio between the operation times (the program pulse widths) required for changing the threshold becomes, if applied to the above-mentioned expression of $\{(t2/t1)= 10E(\Delta Vth/Kvth)\}$, 2. Further, in the case where the mincing width ΔVth of the variation of the threshold is controlled so as to be smaller, for example, in the case of 0.1 V, the ratio between the operation times (the program pulse widths) required for changing the threshold becomes 1.41.

For the pulse generating circuit for generating the operation time (the program pulse width) required for changing the threshold, a binary counter line BCS1 is used in which a plurality of binary counters BCs are arranged in a line, i.e., in series and a portion for fetching the operation time (the program pulse width) required for changing the threshold is controlled by the information relating to the number of operations (program pulses) required for changing the threshold. In the case where the ratio between the operation times (the program pulse widths) required for changing the threshold is 2, the fetching portion of the binary counter line BCS1 is changed each time the repetition number increases, and the program pulse which has the pulse width equal to that of the prior program pulse is supplied. The relationship between the number of operations (program pulses) required for changing the threshold and the operation time (the program pulse width) required for changing the threshold is shown in FIG. 5.

In the case where the ratio between the operation times (the program pulse widths) required for changing the threshold is not the multiplying factor between the binary counters BCs, i.e., 2, the following methods can be considered. A first method is such that in accordance with the number of operations (program pulses) required for changing the threshold, the operation time (the program pulse width) required for changing the threshold is determined. In this case, if the mincing width ΔVth of the variation of the threshold is controlled finely, the repetition number becomes large and also the number of control circuits for generating the pulse width becomes large. A second method is such that a plurality of pulses having the same program pulse width are repeatedly applied to make the resultant value approximately approach the desired ratio. The relationship between the operation for changing the threshold, i.e., the number of program pulses, and the operation time required for changing the threshold, i.e., the program pulse width, in the second method is shown in FIG. 6.

Figure 20:
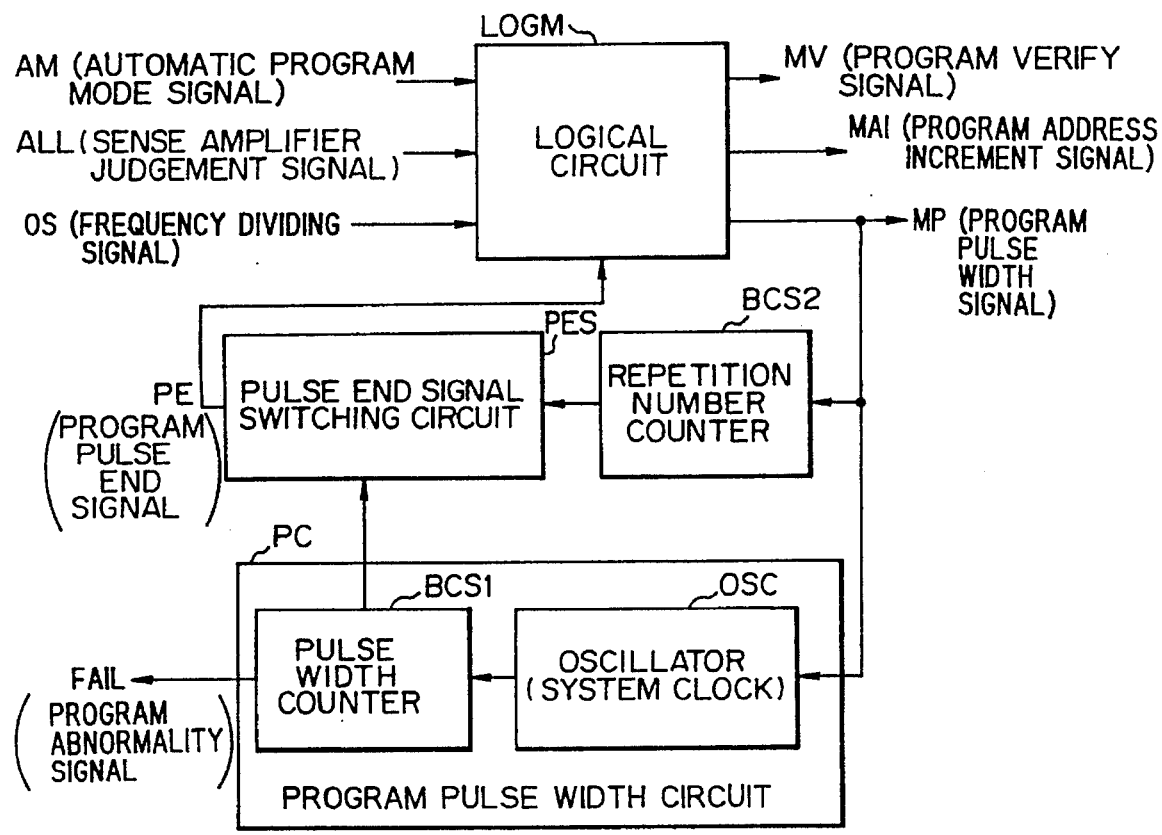
FIG. 20 is a block diagram showing a configuration of a circuit for generating a program pulse and a circuit for generating a verify address which exemplify a program control circuit of the present invention.

FIG. 20 exemplifies, in the form of a block diagram, a program control circuit for implementing the ratio between operation times required for changing the threshold, i.e., the program pulse widths, and for generating a verify address. The program control circuit includes, but is not limited to, a logical circuit LOGM, a program pulse width circuit PC, a repetition number counter BCS2, and a circuit PES for switching a pulse end signal. The program pulse width circuit PC includes an oscillator or a system clock OSC, and a pulse width counter BCS1. In the program control circuit, the logical circuit LOGM receives, as inputs, an automatic program mode signal AM, a sense amplifier judgement signal ALL, a dividing signal OS, and a program pulse end signal PE outputted from the pulse end signal switching circuit PES and produces a program verify signal MV, a program address increment signal MAI, and a program pulse width signal MP.

Figure 21:
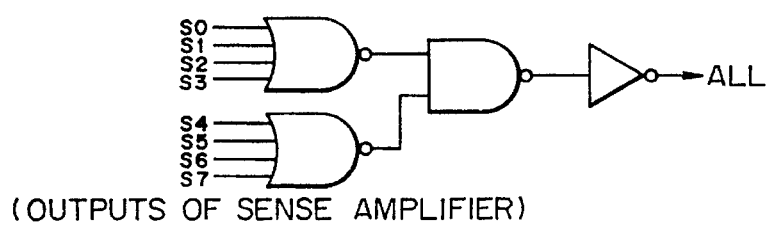
FIG. 21 is a circuit diagram showing a configuration of a circuit for judging a lower threshold state which exemplifies a circuit, for generating a sense amplifier judgement signal ALL, of the present invention.
Figure 22:
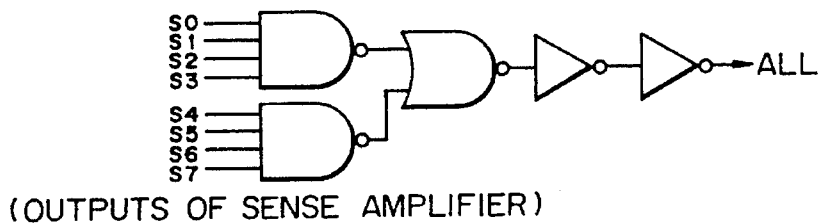
FIG. 22 is a circuit diagram showing a configuration of a circuit for judging a higher threshold state which exemplifies a circuit, for generating a sense amplifier judgement signal ALL, of the present invention.

FIGS. 21 and 22 show examples of a circuit for generating the sense amplifier judgement signal ALL. While not particularly limited thereto, in the case of the read operation in which the selection of the memory cells is performed in units of 8 bits, the outputs of the sense amplifier are assumed to be output signals S0 to S7.

FIG. 21 shows an example of a circuit for judging the state of the lower threshold of the memory cell. Only when all the outputs S0 to S7 of the sense amplifier are in a low state, i.e., the level of the threshold of the memory cells is low, the sense amplifier judgement signal ALL goes to high.

FIG. 22 shows an example of a circuit for judging the state of the higher threshold of the memory cells. Only when all the outputs S0 to S7 of the sense amplifier are in a high state, the level of the threshold of the memory cells is high, the sense amplifier judgement signal ALL goes to high.

Figure 23:
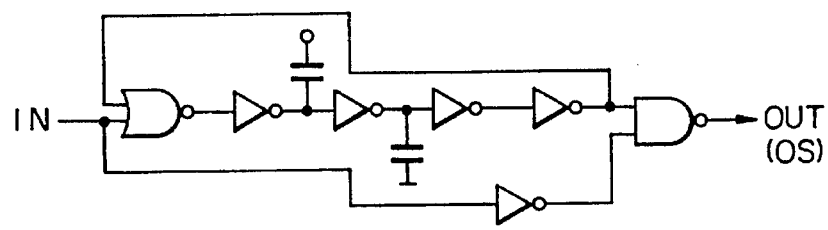
FIG. 23 is a circuit diagram showing a configuration of an example of a circuit for generating a dividing signal OS and a oscillator circuit OSC.

FIG. 23 shows an example of the generation of the dividing signal OS and the oscillator circuit OSC shown in FIG. 20. When an input signal IN is in a low state, the level of an output signal OUT goes to a high state, and then a low state alternately. Thus, the oscillation state is provided. Therefore, the dividing signal OS is the output signal out of the that circuit.

Figure 24:
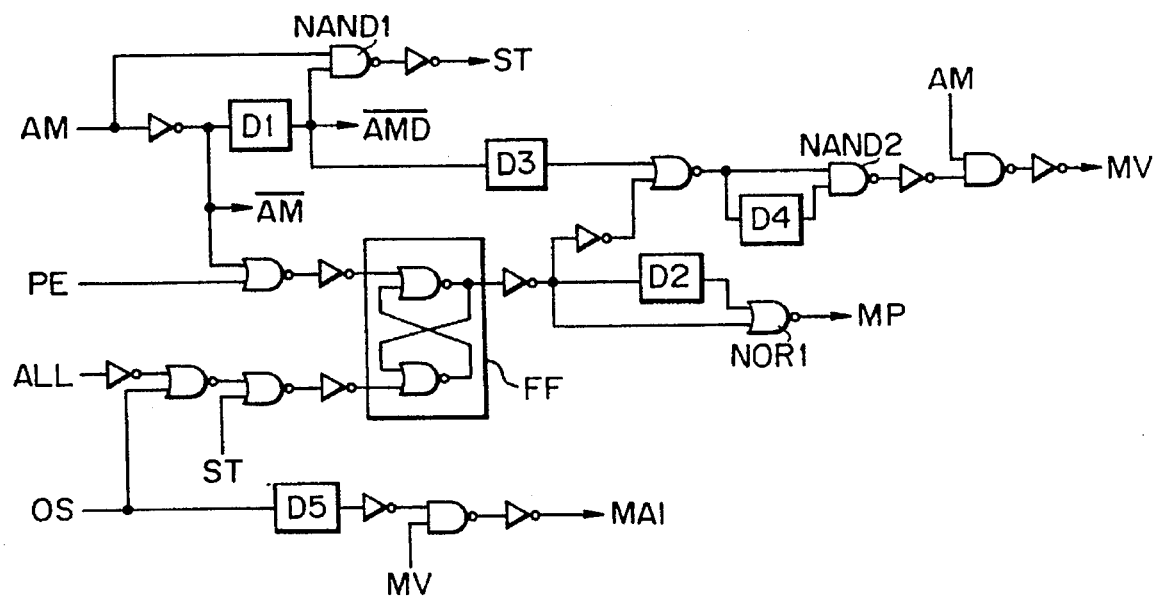
FIG. 24 is a circuit diagram showing a configuration of an example of a logical circuit LOGM of the present invention.
Figure 25:
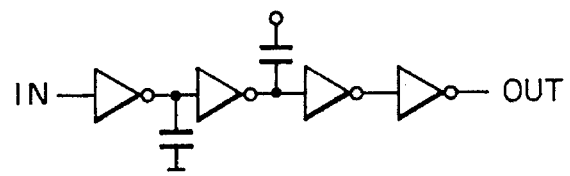
FIG. 25 is a circuit diagram showing a configuration of an example of a delay circuit Di of the present invention.
Figure 26:
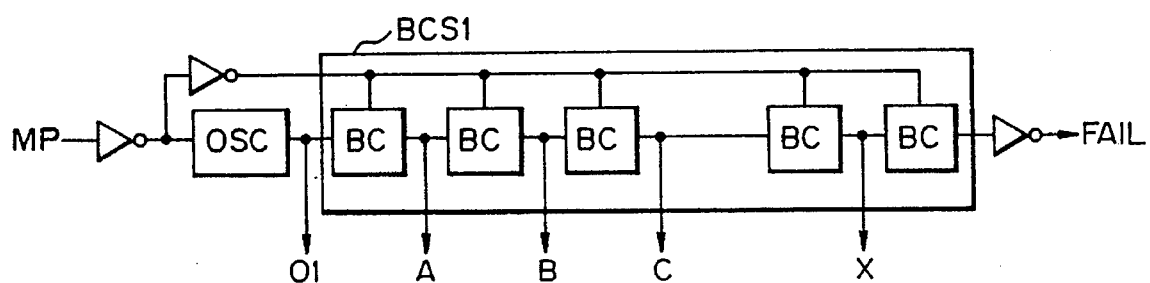
FIG. 26 is a circuit diagram showing a configuration of an example of a program pulse width circuit PC of the present invention.
Figure 27:
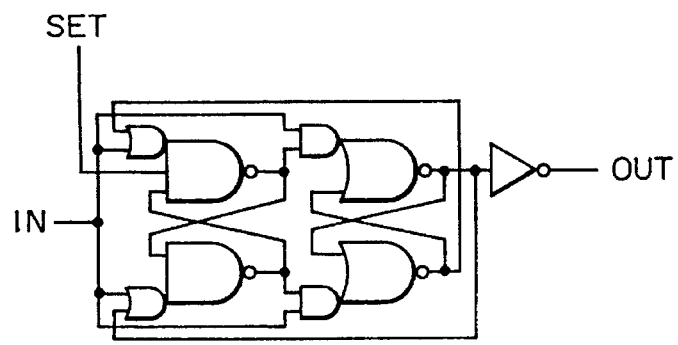
FIG. 27 is a circuit diagram showing a configuration of an example of a binary counter circuit BC of the present invention.
Figure 28:
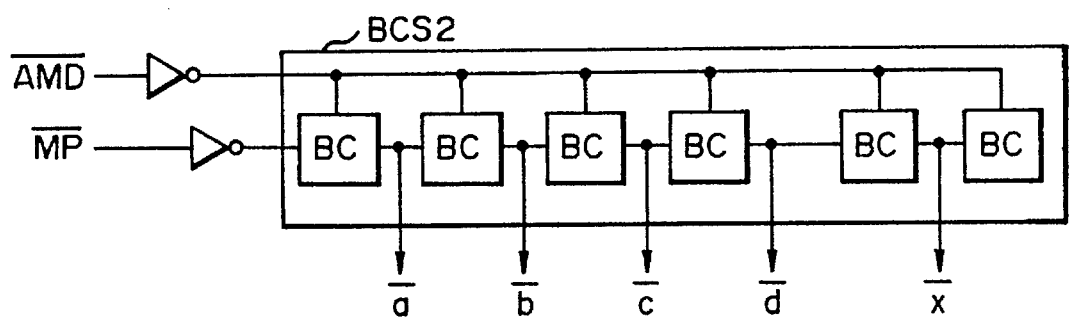
FIG. 28 is a circuit diagram showing a configuration of an example of a circuit BCS2, for counting the repetition number, of the present invention.
Figure 29:
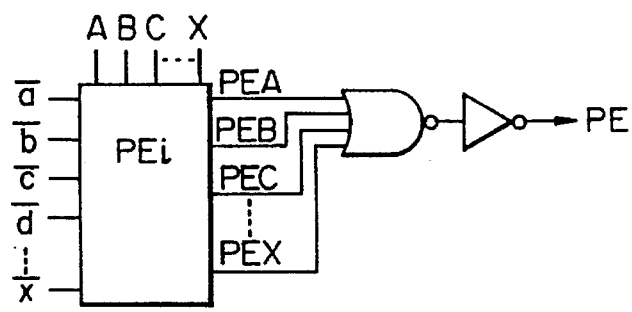
FIG. 29 is a circuit diagram showing a configuration of an example of a circuit PES, for switching a pulse end signal, of the present invention.
Figure 30:
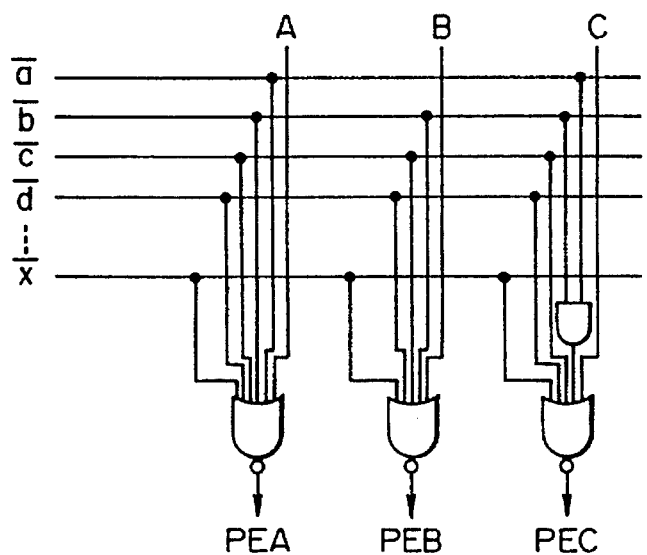
FIG. 30 is a circuit diagram showing a configuration of an example of a pulse control circuit PEi, for doubling a pulse width, of the present invention.
Figure 31:
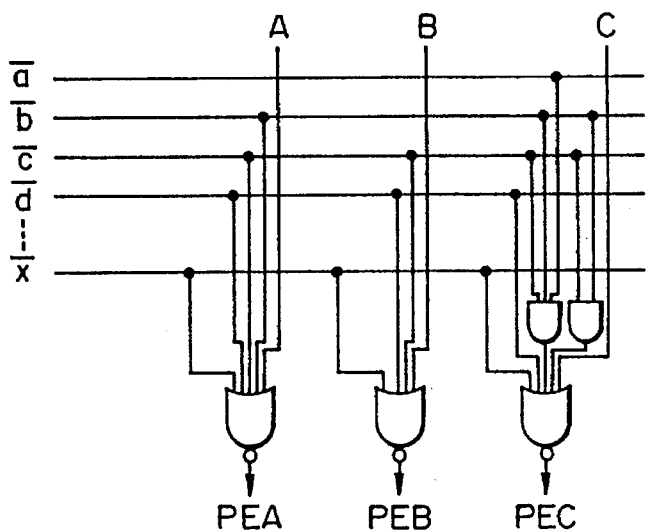
FIG. 31 is a circuit diagram showing a configuration of an example of a pulse control circuit PEi for generating repeatedly the same pulse by two times of the present invention.
Figure 33:
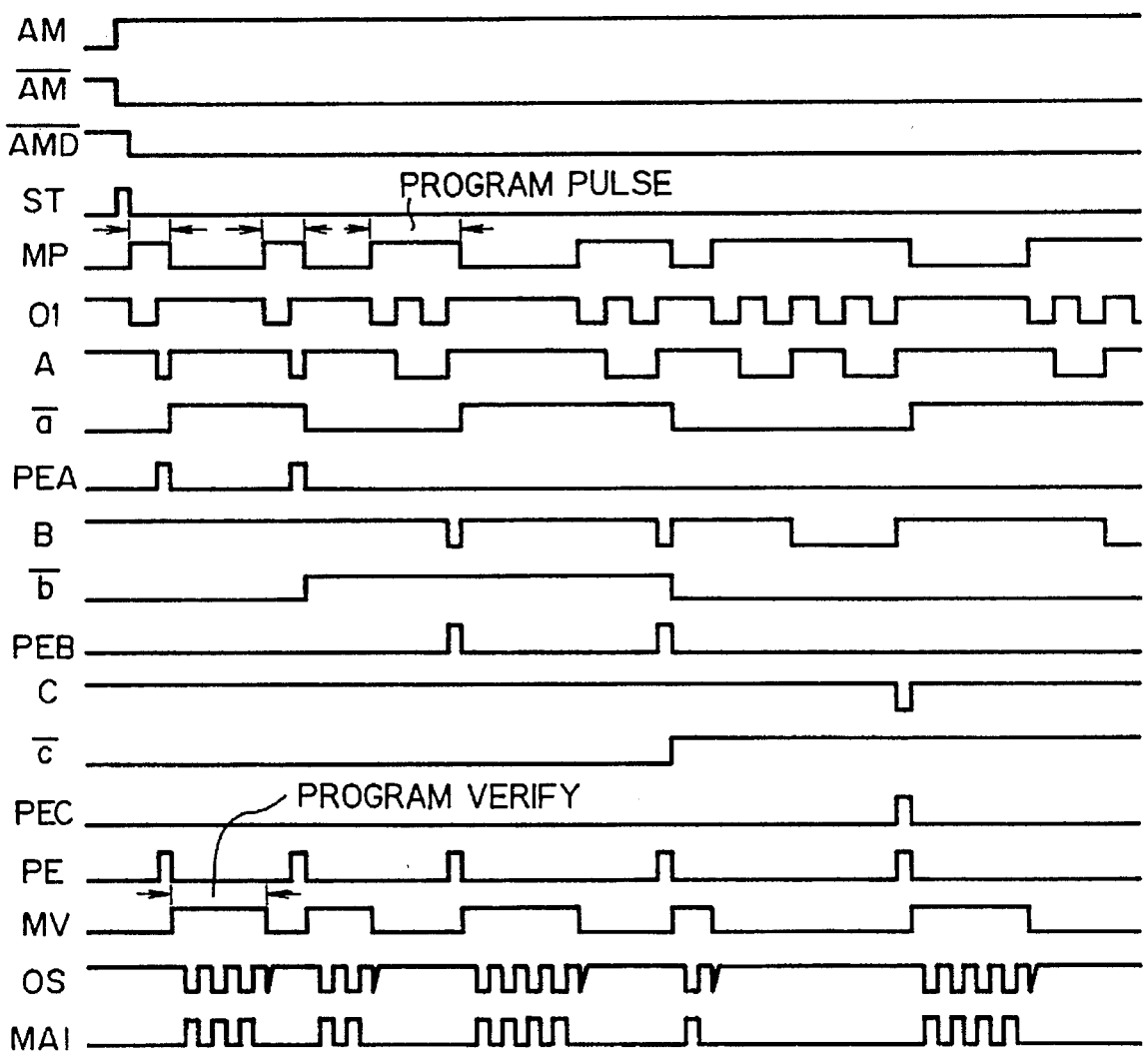
FIG. 33 is a timing chart showing waveforms useful in explaining the operation for applying repeatedly the same pulse by two times of present invention.

FIG. 24 shows an example of a configuration of the logical circuit LOGM in FIG. 20. FIG. 25 shows an example of a configuration of a delay circuit Di (i=1 to 5) in FIG. 24. FIG. 26 shows an example of a configuration of the program pulse width circuit PC in FIG. 20. FIG. 27 shows an example of a configuration of a binary counter oscillation circuit BC. FIG. 28 shows an example of a configuration of the repetition number counter circuit BCS2 in FIG. 20. FIG. 29 shows an example of a configuration of the pulse end signal switching circuit PES in FIG. 20. In addition, FIG. 30 shows an example of a configuration of a pulse control circuit PEi in FIG. 29 in which the ratio between the operation times (the program pulse widths) for changing the threshold is set to 2. FIG. 31 shows an example of a configuration of the pulse control circuit PEi which is capable of repeating the same pulse by two times as an example. Further, FIGS. 32 and 33 show waveform time charts, respectively.

The operation for generating the program pulse and the operation for generating the verify address will hereinbelow be described with reference to FIGS. 20, 21, 24, 26, 28, 29, 30 and 32.

Figure 32:
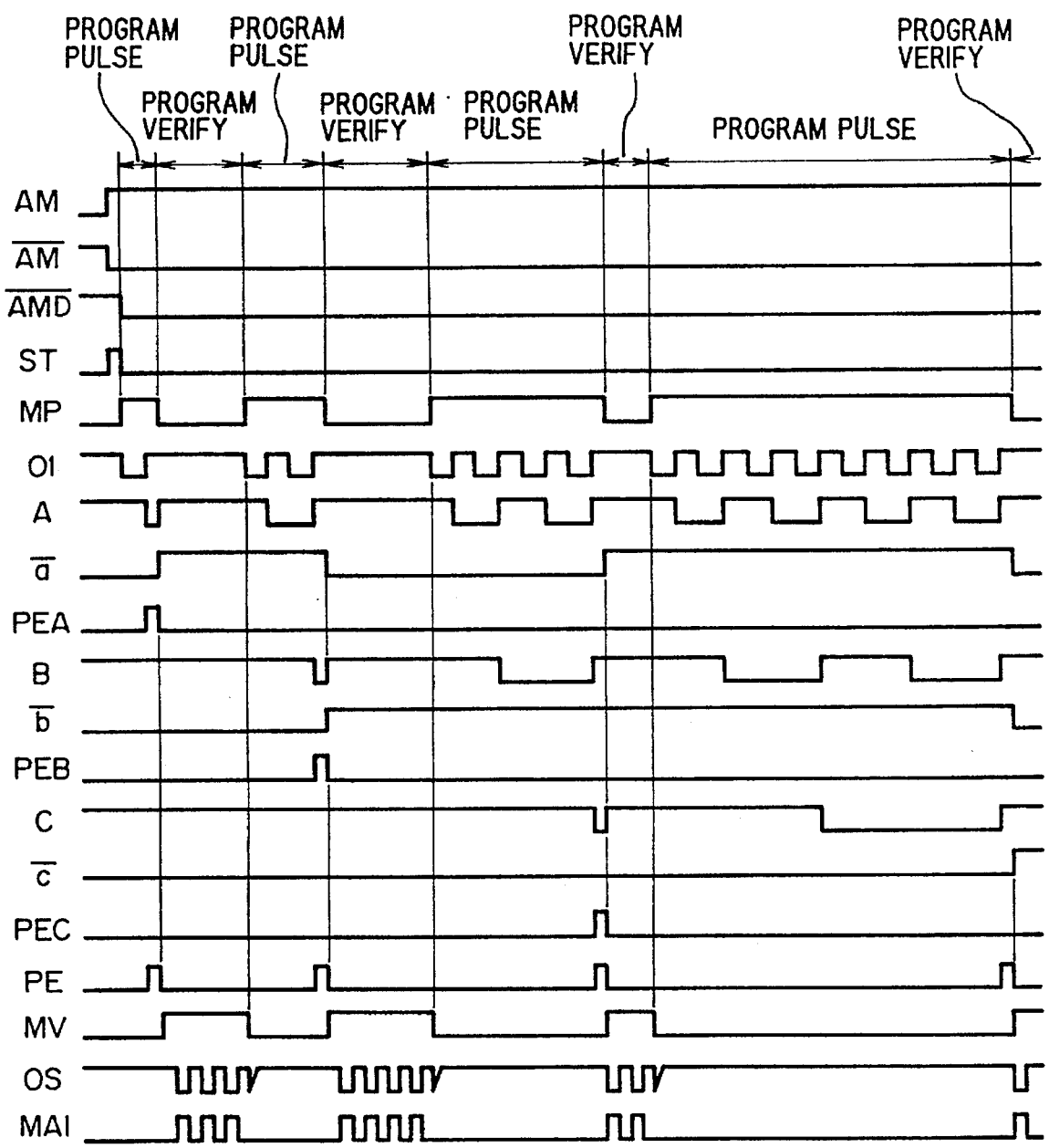
FIG. 32 is a timing chart showing waveforms useful in explaining the operation for doubling the pulse width of the present invention.

Referring now to the logical circuit LOGM of FIG. 24 and the waveform timing chart of FIG. 32 in which the program pulse width is doubled, in the operation mode for changing the threshold of the memory cells, first, an automatic mode set signal AM enters into the rise operation period. In addition, along with the rise of the automatic set signal AM, an inverted signal $\overline{AM}$ associated therewith falls and just after the elapse of the time delay set in a delay circuit D1, an automatic mode set delay signal $\overline{AMD}$ falls.

A NAND circuit NAND1 receives, as inputs, both the automatic mode set signal AM and the automatic mode set inverted delay signal $\overline{AMD}$ and then produces a start signal which goes to a high level for a fixed period of time. After receiving this start signal, a flip-flop circuit FF is set. Both an output from the flip-flop circuit FF and a signal which is obtained after that output signal has passed through a delay circuit D2 are input to a NOR circuit NOR1. Then, after the lapse of the delay time set in the delay circuit D2, the program pulse width signal MP rises. Since the program pulse width signal MP is at a high level, the electric charges accumulated in the floating gate in the memory cell are moved so that the program state is started.

Each of the program pulse width circuit PC (refer to FIG. 26) and the repetition number counter circuit BCS2 (refer to FIG. 28) shown in FIG. 20 receives the program pulse width signal MP having a high level to be activated, and the program pulse end signal PE as the output signal of the pulse end signal switching circuit PES (refer to FIG. 29) is changed from a low level to a high level on the basis of the information of the program number, thereby resetting the flip-flop circuit FF. In correspondence to this operation, the program pulse width signal MP falls to stop the movement of the electric charges from the floating gate of the memory cell, thereby completing the program state.

After the lapse of the delay time set in the delay circuit D4 by both the delay circuit D4 and the NAND circuit NAND2, a program verify signal MV rises so that the processing proceeds to the verify operation. The dividing signal OS of the reference pulse for verify is a signal wherein the first half of the period is at a high level and the second half thereof is at a low level. For a period of time when the dividing signal OS is at a low level, the sense amplifier judgement signal ALL for the output signals S0 to S7 from the sense amplifier is received in the case where the output signals S0 to S7 have 8 bits.

Now, in the case where the program operation is assumed to be the operation for lowering the threshold of the memory cells, the circuit for generating the sense amplifier judgement signal ALL has, for example, a configuration as shown in FIG. 21. Then, when the output signals S0 to S7 having all the bits which have been outputted from the sense amplifier are at a low level, in other words, if each threshold of the memory cells are at a low level, the flip-flop circuit FF of FIG. 24 is not set and, in response to the program address increment signal MAI, an internal address signal representing the next address is produced, and then for a period of time when the frequency-dividing signal OS is at a low level, the judgement is performed again. If out of the output signals S0 to S7 of the sense amplifier, the signals corresponding to 1 bit or more are at a high level, that is, if there is any one memory cell in which it is judged that even for 1 bit, the operation for lowering the threshold is insufficient, the flip-flop circuit FF is set, and the program pulse width signal MP goes to a high level again, so that the operation for changing the threshold of the memory cells is performed.

Thereafter, the verify operation is executed again. At this time, by the function of the delay circuit D5 of FIG. 24, the final pulse of the frequency-dividing signal OS is controlled so as not to appear in the program address increment signal MAI. Thus, the address is maintained in which it is finally judged that the operation for changing the threshold is insufficient. In other words, the verify operation after the operation for changing the threshold has been performed again is executed from the address in which it has been judged in the prior verify that the operation for changing the threshold was insufficient.

If by repetition of the above-mentioned operations, the memory cells corresponding to all the addresses are verified, the operation mode set signal for changing the threshold falls, and then the mode is completed.

Next, description will hereinbelow be made with respect to the operation for generating the program pulses (corresponding to the operation time required for changing the threshold) each having the pulse width, which is always two times as wide as that of the prior set of pulses every predetermined number of operations for changing the threshold (application of the predetermined number of program pulses) with reference to FIGS. 26, 28, 29, 30 and 32. The pulse end signal switching circuit PES of FIG. 29 generates the program pulse end signal PE on the basis of the function of the pulse control circuit PEi. FIG. 30 shows an example of a configuration of the pulse control circuit PEi for always doubling the program pulse width. Signals A, B and C shown in FIG. 30 are the output signals supplied from the pulse width counter BCS1 in the program pulse width circuit PC of FIG. 26, and signals $\bar{a}$, $\bar{b}$, $\bar{c}$, $\bar{d}$ and $\bar{x}$ represent respectively the output signals supplied from the repetition number counter circuit BCS2 of FIG. 28. In other words, the program pulse width signals A, B and C are the input signals for individual pulse end signals PEA, PEB and PEC and are controlled by program pulse number information signals $\bar{a}$ to $\bar{x}$.

In the waveform timing chart shown in FIG. 32, the first program pulse width signal MP is activated by the following waveform timing. In response to an oscillator output $O_1$ at a high level shown in FIG. 26, the output signal A of the pulse width counter BCS1 goes to a low level. On the other hand, since the output signals $\bar{a}$ to $\bar{x}$ of the repetition number counter circuit BCS2 shown in FIG. 28 are at a low level, the pulse end signal PEA in FIG. 30 goes to a high level, and as a result, the program pulse end signal PE of FIG. 29 rises and also the program pulse width signal MP falls. The first program pulse width signal MP corresponds to one period of time when the oscillator output $O_1$ is at a low level. Thereafter, in response to the fall of the program pulse width signal MP, the output signal $\bar{a}$ of the repetition number counter circuit BCS2 rises.

For the second time, in response to the oscillator output $O_1$ at a high level, the output signal A of the pulse width counter BCS1 goes to a low level, and in response to the oscillator output $O_1$ at a high level again, the output signal A goes to a high level. At this time, the output signal B of the pulse width counter BCS1 goes to a low level, and in response to the output signals $\bar{b}$ to $\bar{x}$ of the repetition number counter circuit BCS2, the pulse end signal PEB goes to a high level. In other words, by performing the above-mentioned operation, the program number is not received independently of the output signal $\bar{a}$ of the repetition number counter circuit BCS2. The second program pulse width signal MP corresponds to the two periods of time when the oscillator output $O_1$ is at a low level.

For the third time, the oscillator output $O_1$ at a high level is received by four times. Then, the output signal C of the pulse width counter BCS1 goes to a high level, each of the output signals $\bar{a}$ and $\bar{b}$ of the repetition number counter circuit BCS2 at that time goes to a high level, and on the basis of combination of the logical product thereof and other output signals $\bar{c}$ to $\bar{x}$, the pulse end signal PEC goes to a high level. The third program pulse width signal MP corresponds to the four periods of time when the oscillator output $O_1$ is at a low level.

The fourth program pulse width signal MP corresponds to the eight periods of time when the oscillator output $O_1$ is at a low level. Thus, the n-th program pulse width signal MP corresponds to the (2E-1) periods of time when the oscillator output $O_1$ is at a low level.

Next, as one example in which a plurality of program pulses having the same pulse width are repeatedly applied, the case of the two repetition of such a program pulse will hereinbelow be described with reference to the pulse control circuit PEi of FIG. 31 and the waveform timing chart of FIG. 33.

In the waveform timing chart shown in FIG. 33, each of the output signals $\bar{b}$ to $\bar{x}$ of the repetition number counter circuit BCS2 corresponding to the first and second program pulse width signals is at a low level. Therefore, as shown in FIG. 31, on the basis of combination of those output signals and the output signal A of the pulse width counter BCS1, the pulse end signal PEA is produced. In other words, the control is performed independently of the level of the output $\bar{a}$ of the repetition number counter circuit BCS2. Each of the first and second program pulse width signals MP corresponds to one period of time when the oscillator output $O_1$ is at a low level.

Since each of the output signals $\bar{c}$ to $\bar{x}$ of the repetition number counter circuit BCS2 corresponding to the third and fourth program pulse width signals MP is at a low level, on the basis of a combination of those output signals and the output signal B of the pulse width counter BCS1, the pulse end signal PEB is produced. In other words, the control is performed independently of the levels of the output signals $\bar{a}$ and $\bar{b}$ of the repetition number counter circuit BCS2. Each of the third and fourth program pulse width signals MP corresponds to two periods of time when the oscillator output $O_1$ is at a low level.

For the fifth and sixth times, on the basis of a combination of the output signal c of the pulse width counter BCS1, the logical product of the output signals $\bar{b}$ and $\bar{c}$ at a low level of the repetition number counter circuit BCS2, the logical product of the output signals $\bar{a}$, $\bar{b}$ and $\bar{c}$ at a low level thereof, and other output signals $\bar{d}$ to $\bar{x}$ at a low level, the pulse end signal PEC goes to a high level. Each of the fifth and sixth program pulse width signals MP corresponds to four periods of time when the oscillator output $O_1$ is at a low level.

In addition, the method of applying repeatedly a plurality of program pulses having the same pulse width can be realized in such a way that the repetition number counter circuit BCS2 is divided into two systems so that a first system of the repetition number counter circuit BCS2 operates to receive the information of the repetition number and a second system of the repetition number counter circuit BCS2 operates to produce the input signals $\bar{a}$ to $\bar{x}$ of the pulse control circuit PEi.

In the case where the number of operations (program pulses) for changing the threshold is small, the operation time (the program pulse width) required for changing the threshold corresponding to the number of program operations may be programmed in the inside of the device.

Figure 34:
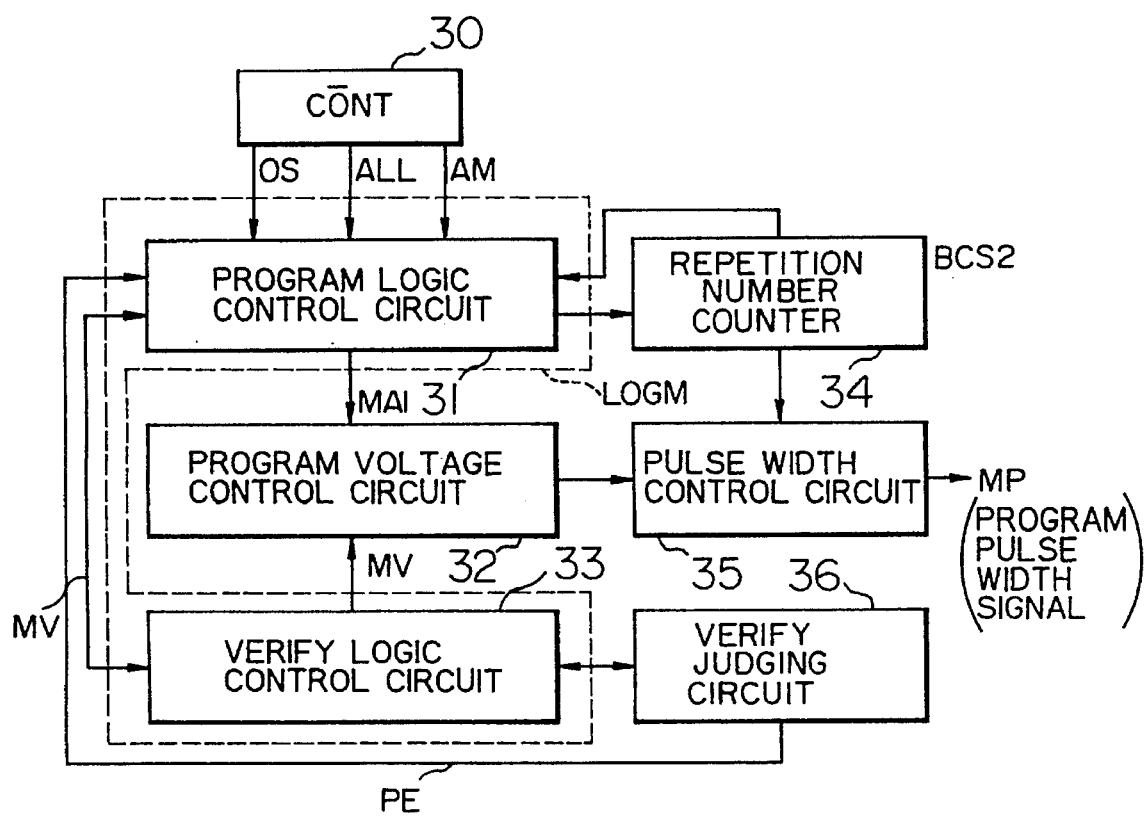
FIG. 34 is a block diagram showing a configuration of another embodiment of the present invention.
Figure 35:
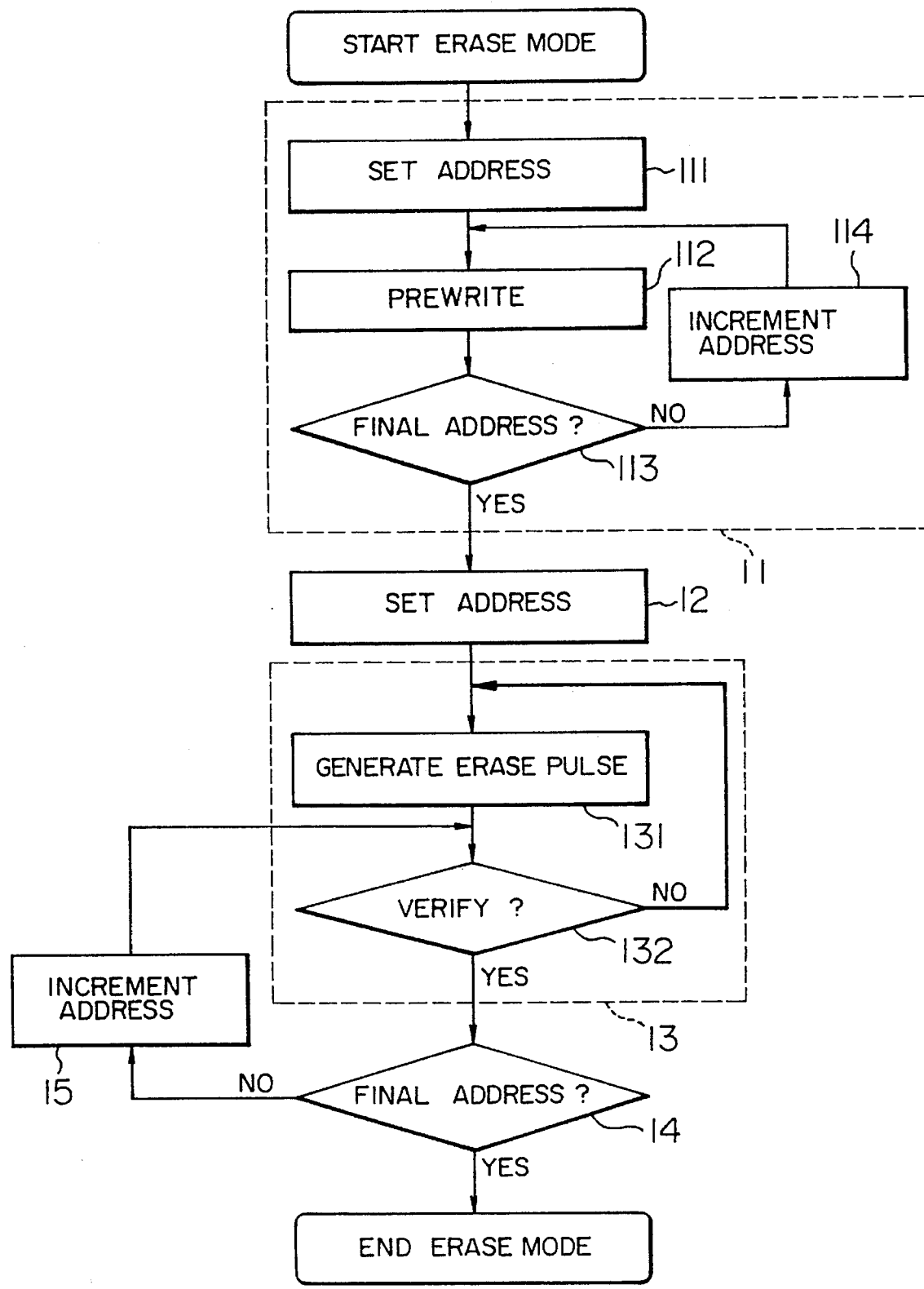
FIG. 35 is a flow chart showing the algorithm of the erase mode as the operation for lowering the threshold in the prior art example.

FIG. 34 is a block diagram showing a configuration of a program unit of a semiconductor nonvolatile memory device according to another embodiment of the present invention. In the Figure, the same reference numerals as those of the above-mentioned embodiment represent the same constituent elements and signals.

In FIG. 34, the program unit includes, but is not limited to, a timing control circuit 30, a circuit 31 for controlling program logic, a circuit 32 for controlling a program voltage, a circuit 33 for controlling verify logic, a counter 34 for counting the number of program operations, a circuit 35 for controlling a pulse width, and a verify judging circuit 36. The program pulse width signal MP is output from the pulse width controlling circuit 35 to the decoders AX and AY (refer to FIG. 7) of the memory cell array, thereby executing the program operation for the memory cells. Both the program logic controlling circuit 31 and the verify logic controlling circuit 33 corresponds in configuration to the logical circuit LOGM of FIG. 20 and the circuit operation thereof is substantially the same as that of logical circuit LOGM.

As set forth hereinabove, according to the present invention, the semiconductor nonvolatile memory device of the present invention can reduce the total number of operations (program pulses) for changing the threshold by increasing the pulse width of the program pulse as the number of repetition increases. In other words, it is possible to shorten the overhead time of the time required for switching between the program operation and the verify operation, and the time required for performing the verify operation itself relative to the time required for performing the program operation mode. In addition, the means for controlling application of the program pulse is provided in the inside of the semiconductor nonvolatile memory device, whereby the control by the CPU in the system in which the semiconductor nonvolatile memory device is employed has only to be performed for a short period of time required for starting the program mode, and the subsequent program operation is automatically performed only in the inside of the semiconductor nonvolatile memory device. Therefore, the burden imposed on the CPU can be remarkably reduced.

What is claimed is:

1. A semiconductor nonvolatile memory device including memory cells, each including a transistor, which is capable of electrically programming a threshold voltage, said memory device comprising:

programming means for performing programming for said memory cells by repeating a plurality of programming operations;

verify means for reading out a state of the memory cells to which at least one programming is performed during repetition of the programming operation by said programming means;

control means for controlling, on the basis of information on the state of memory cells read out by said verify means, said programming means to control succession and stopping of the repetition operation of the programming for said memory device, and pulse control means for controlling a programming pulse in the repetitive programming operation, to change the programming pulse width according to the repetition number of the programming operations.

2. A semiconductor nonvolatile memory device according to claim 1, wherein said pulse control means includes means for increasing the programming pulse width as the repetition number of the programming operations increases.

3. A semiconductor nonvolatile memory device according to claim 1, wherein said pulse control means includes means for increasing the programming pulse width whenever the repetition number of the programming operations increases by a plurality of times.

4. A semiconductor nonvolatile memory device according to claim 1, wherein said pulse control means includes programming means for programming the relationship between the programming pulse width and the repetition number of the programming operations.

5. A semiconductor nonvolatile memory device according to claim 1, further comprising means for counting the repetition number of the programming operations.

6. A semiconductor nonvolatile memory device according to claim 5, further comprising detection means for enabling detection of whether said semiconductor nonvolatile memory devices is in a state of operation or is completed with the operation thereof, the detection being effected from the outside in the electrically programming mode by using a status register or a ready busy pin.

7. A method of programming collectively a plurality of memory cells, each including a transistor, which is capable of electrically programming a threshold voltage, said method comprising the steps of:

executing the programming of said memory cells on the basis of a combination in which a programming operation and a verify operation are alternately performed by a plurality of times;

judging, on the basis of the information provided by said verify operation, whether or not the repetition of the programming operation is required; and applying, when said judgement result indicates the succession of the repetitive operation, programming pulses in which a programming pulse width in said programming operation is increased as the repetition number increases to said memory cells.

8. A semiconductor nonvolatile memory device according to claim 2, wherein the programming pulse width is doubled with each additional repetition of a corresponding programming operation.

9. A semiconductor nonvolatile memory device according to claim 3, wherein the programming pulse width is increased after each occurrence of two additional repetitions, at a same programming pulse width, of a corresponding programming operation.

10. A semiconductor nonvolatile memory device according to claim 9, wherein each increase of the programming pulse width represents a doubling thereof.

11. A method of programming collectively a plurality of memory cells according to claim 7, wherein the programming pulse width is doubled with each additional repetition of a corresponding programming operation.

12. A method of programming collectively a plurality of memory cells according to claim 7, wherein the programming pulse width is increased after each occurrence of two additional repetitions of a programming pulse, at a same pulse width, of a corresponding programming operation.

13. A method of programming collectively a plurality of memory cells according to claim 12, wherein each increase of the programming pulse width represents a doubling thereof.

* * * * *